(12) United States Patent
Ono et al.

(10) Patent No.: US 9,245,939 B2
(45) Date of Patent: Jan. 26, 2016

(54) ORGANIC ELECTROLUMINESCENCE DISPLAY PANEL AND ORGANIC ELECTROLUMINESCENCE DISPLAY APPARATUS

(75) Inventors: Shinya Ono, Osaka (JP); Kouhei Ebisuno, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/354,653

(22) PCT Filed: Nov. 7, 2011

(86) PCT No.: PCT/JP2011/006192
§ 371 (c)(1),
(2), (4) Date: Apr. 28, 2014

(87) PCT Pub. No.: WO2013/069042
PCT Pub. Date: May 16, 2013

(65) Prior Publication Data
US 2014/0299867 A1    Oct. 9, 2014

(51) Int. Cl.
H01L 29/08 (2006.01)
H01L 27/32 (2006.01)
H01L 51/52 (2006.01)

(52) U.S. Cl.
CPC ........ H01L 27/3279 (2013.01); H01L 51/5228 (2013.01); *H01L 27/3246* (2013.01)

(58) Field of Classification Search
CPC ... H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

| 6,940,214 | B1 | 9/2005 | Komiya et al. |
| 7,679,284 | B2 | 3/2010 | Kubota |
| 7,786,668 | B2 | 8/2010 | Hayashi |
| 7,994,711 | B2 | 8/2011 | Nakamura et al. |
| 8,094,096 | B2 | 1/2012 | Okumoto |
| 8,289,242 | B2 | 10/2012 | Okumoto |
| 8,643,267 | B2 | 2/2014 | Matsuura et al. |
| 8,823,257 | B2 | 9/2014 | Fujita et al. |
| 2007/0029929 | A1 | 2/2007 | Nakamura et al. |

(Continued)

FOREIGN PATENT DOCUMENTS

| JP | 2000-231346 | 8/2000 |
| JP | 2007-073499 | 3/2007 |

(Continued)

OTHER PUBLICATIONS

International Search Report and Written Opinion (ISR/WO) from PCT/JP2011/006192, mail date is Jan. 10, 2012, together with English translation of ISR.

(Continued)

*Primary Examiner* — David Vu
*Assistant Examiner* — Cuong Nguyen
(74) *Attorney, Agent, or Firm* — Greenblum & Bernstein, P.L.C.

(57) ABSTRACT

An organic electroluminescence (EL) display panel includes a cathode electrode formed above a bank and formed opposite to a plurality of anode electrodes, and a charge functional layer commonly formed for each of the organic light-emitting layers across a plurality of aperture areas formed in the bank. A distance from the center of the display region to the end of the cathode electrode is shorter than a distance from the center of the display region to the end of the charge functional layer.

14 Claims, 18 Drawing Sheets

(56) References Cited

U.S. PATENT DOCUMENTS

| | | |
|---|---|---|
| 2008/0191603 A1 | 8/2008 | Kubota |
| 2009/0200930 A1 | 8/2009 | Hayashi |
| 2010/0289417 A1 | 11/2010 | Fujita et al. |
| 2010/0302221 A1 | 12/2010 | Okumoto |
| 2011/0057920 A1 | 3/2011 | Matsuura et al. |
| 2012/0074397 A1 | 3/2012 | Okumoto |
| 2012/0181526 A1 | 7/2012 | Kasahara et al. |

FOREIGN PATENT DOCUMENTS

| | | |
|---|---|---|
| JP | 2008-218395 | 9/2008 |
| JP | 2009-193754 | 8/2009 |
| JP | 2009-302016 | 12/2009 |
| JP | 2010-267935 | 11/2010 |
| JP | 2011-040167 | 2/2011 |
| JP | 2011-076795 | 4/2011 |
| JP | 2011-077028 | 4/2011 |
| WO | 2010/070798 | 6/2010 |
| WO | 2010/100922 | 9/2010 |

OTHER PUBLICATIONS

U.S. Appl. No. 14/354,630 to Shinya Ono et al., filed Apr. 28, 2014.
U.S. Appl. No. 14/354,700 to Shinya Ono et al., filed Apr. 28, 2014.
U.S. Appl. No. 14/354,757 to Shinya Ono et al., filed Apr. 28, 2014.
Office Action issued in Japan Counterpart Patent Appl. No. 2013-542676, dated Sep. 8, 2015.

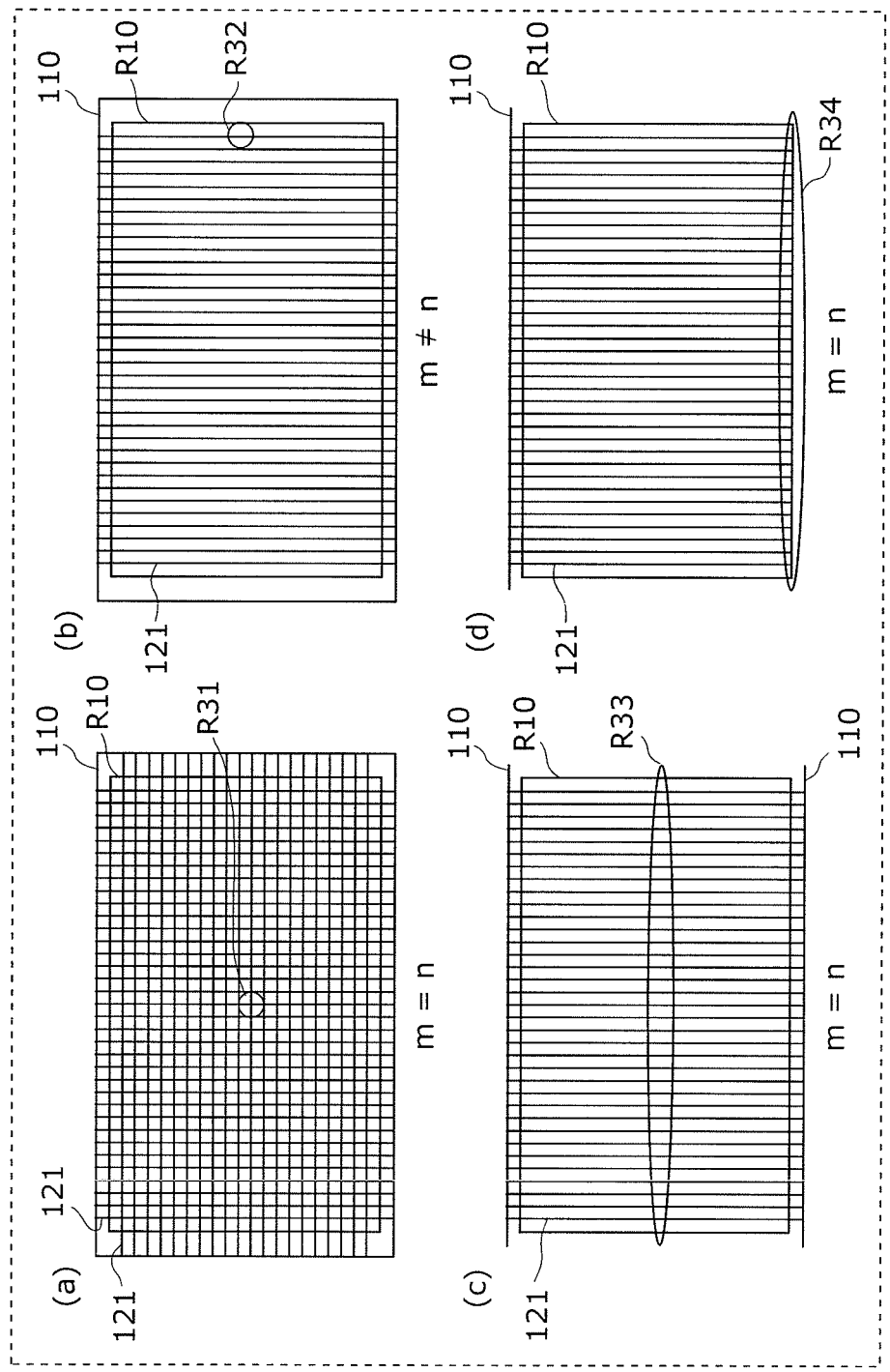

ORGANIC ELECTROLUMINESCENCE DISPLAY PANEL AND ORGANIC ELECTROLUMINESCENCE DISPLAY APPARATUS

TECHNICAL FIELD

The present invention relates to an organic electroluminescence (EL) panel and an organic EL display apparatus which use organic EL elements.

BACKGROUND ART

Conventionally, as this type of the organic EL display panel and the organic EL display apparatus, a configuration is known where an auxiliary electrode is provided to prevent a voltage drop in the central portion in the display panel screen due to an increase in size of the display panel (refer to FIG. 4 in Patent Literature 1). Hereinafter, the technique disclosed in Patent Literature 1 is also referred to as the conventional technique A.

In this conventional technique A, a plurality of the first electrodes are displaced as a pixel electrode above an insulating layer, the pixel electrodes are partitioned by a bank, and a light-emitting functional layer is formed in each of the regions partitioned by the bank. A second electrode is commonly formed as a common electrode which covers all the light-emitting functional layers partitioned by the bank. Then, a power line for the second electrode is provided in a peripheral region of an effective region as a power providing source for the common electrode.

The above described auxiliary electrode is provided above the insulating layer and between the pixel electrodes. The auxiliary electrode is electrically connected to the second electrode in the effective region. With this, power is provided via the auxiliary electrode to the second electrode, which prevents a voltage drop in the effective region.

It should be noted that in the conventional technique A, as a driving thin film transistor which drives light-emitting elements, a p-type TFT is disclosed (refer to FIG. 2 and paragraph 0018 in Patent Literature 1).

CITATION LIST

Patent Literature

[PTL 1]
Patent Literature 1: Japanese Unexamined Patent Application Publication No. 2008-218395 (FIG. 4, FIG. 2, and paragraph 0018)

SUMMARY OF INVENTION

Technical Problem

However, the conventional technique A has the following problem.

In other words, in the above described conventional technique A, the light-emitting functional layer has a configuration where all or some of an organic EL substance (organic light-emitting layer), a hole injection layer, a hole transport layer, an electron transport layer, an electron injection layer, a hole block layer, and an electron block layer are included, and patterning is performed on each of the light-emitting elements. Accordingly, a process of performing patterning on each of the layers included in the light-emitting functional layer is necessary, and a facility is required for performing the process, a manufacturing process is complicated, thereby generating a high cost.

Moreover, there is a problem that unevenness in display (degradation in display quality) is generated due to unevenness in voltage distribution of the common electrode of the light-emitting elements in the effective region (display region).

In view of this, the present invention is conceived to solve the above described problem, and an object thereof is to provide an organic EL display panel and an organic EL display apparatus which can improve the unevenness in voltage and reduce the degradation in display quality.

Solution to Problem

In order to solve the above described problem an organic EL display panel according to an aspect of the present invention comprises: a thin-film transistor (TFT) layer including an n-type TFT as a driving TFT; an insulating layer provided above the TFT layer; a plurality of anode electrodes arranged in a display region located above the insulating layer; an auxiliary wiring which is arranged in a peripheral region of the display region and in the display region and is arranged separately from the anode electrodes in the display region; a bank in which a plurality of aperture areas are provided above the anode electrodes or the auxiliary wiring in the display region; a cathode electrode provided above the bank and provided above the anode electrodes; an organic light-emitting layer provided between the anode electrode and the cathode electrode, provided in each of the aperture areas above the anode electrodes in the bank; and a charge functional layer commonly provided for each of a plurality of the organic light-emitting layers across the aperture areas, the charge functional layer being provided between the cathode electrode and the bank, a power line which is provided in the peripheral region and provides power to the cathode electrode, wherein the n-type TFT includes a source electrode electrically connected to the anode electrode, the organic light-emitting layer emits light when current corresponding to a voltage between a gate electrode and the source electrode of the n-type TFT flow in a light-emitting period via the anode electrodes to the cathode electrode, a distance from a center of the display region to an end of the cathode electrode is shorter than a distance from the center of the display region to an end of the charge functional layer, and the cathode electrode receives power from the power line at least via the charge functional layer.

Advantageous Effects of Invention

With the present invention, it is possible to improve the unevenness in voltage distribution of the common electrode and reduce the degradation in display quality.

BRIEF DESCRIPTION OF DRAWINGS

FIG. 7 (a)-(d) is a diagram for explaining part of the expression related to a cathode electrode and an auxiliary wiring.

DESCRIPTION OF EMBODIMENTS

Figure 1:
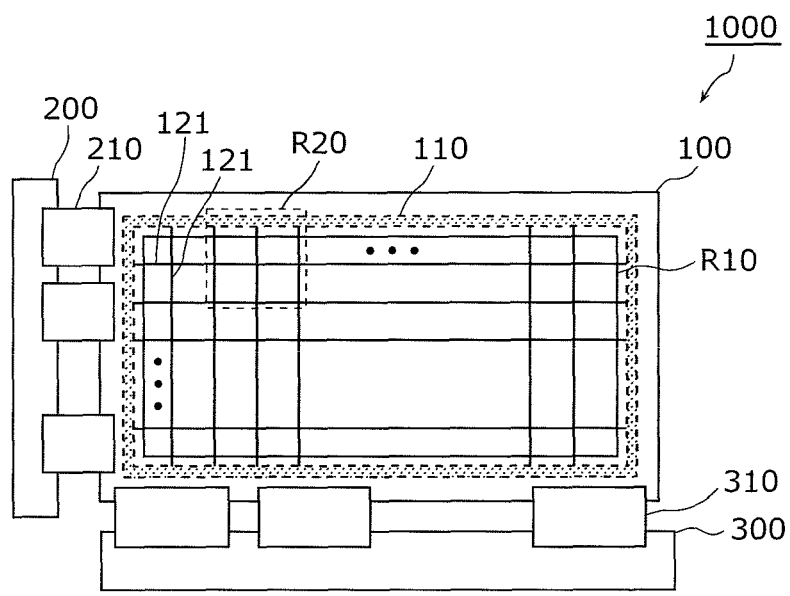
FIG. 1 is a block diagram illustrating a configuration of a display apparatus according to Embodiment 1 of the present invention.

An n-type TFT is used as a driving TFT of an organic light-emitting element, and a source electrode of the n-type TFT is electrically connected to an anode electrode included in the organic light-emitting element. Moreover, an organic light-emitting layer included in the organic light-emitting element emits light when a current corresponding to a voltage between a gate electrode and the source electrode of the n-type TFT in a light-emitting period flows via the anode electrode to the cathode electrode.

Here, the anode potential increases in the case of a shift from a write period in which a potential difference is set in a capacitor in a driving circuit as a pixel to a light-emitting period in which the organic light-emitting layer emits light based on a current corresponding to the potential difference set in the capacitor. Based on this, another electrode potential in the capacitor is increased. Meanwhile, due to the parasitic capacitance between the gate electrode of the n-type TFT and the drain electrode of the n-type TFT, an increase in one of the electrode potentials in the capacitor is reduced. Accordingly, a phenomenon occurs that the potential difference set in the capacitor is compressed by the shift from the write period to the light-emitting period.

When an increase in the cathode voltage (VEE) is even in the display region, a contraction rate of the potential difference set in each of the capacitors in the display region is almost equal. This means that an impact on display variations is small.

However, as described above, in the display region, contact resistance occurs since at least the charge functional layer is interposed between the cathode electrode as a common electrode and the auxiliary wiring. Meanwhile, in a peripheral region of the display region, in a configuration where the cathode electrode and the auxiliary wiring are directly connected to each other and contact resistance does not occur, an increase rate of the cathode voltage (VEE) is higher in the central region of the display region than in the peripheral region of the display region.

Therefore, an amount of increase in the anode potential in the organic light-emitting layer depends on the cathode voltage (VEE). With this, an amount of increase in the gate electrode of the n-type TFT, that is, one of the electrode potentials in the capacitor is larger in the central region having a higher increase rate of the cathode voltage (VEE) than that of the peripheral region, and a contraction rate of the potential difference set in the capacitor is higher in the central region than the peripheral region. Therefore, even when the capacitors in the peripheral region and the central region hold the same voltage in the write period, the capacitors in the peripheral region and the central region hold a different voltage held in the light-emitting period.

In view of this, an organic EL display panel according to an aspect of the present invention comprises: a thin-film transistor (TFT) layer including an n-type TFT as a driving TFT; an insulating layer provided above the TFT layer; a plurality of anode electrodes arranged in a display region located above the insulating layer; an auxiliary wiring which is arranged in a peripheral region of the display region and in the display region and is arranged separately from the anode electrodes in the display region; a bank in which a plurality of aperture areas are provided above the anode electrodes or the auxiliary wiring in the display region; a cathode electrode provided above the bank and provided above the anode electrodes; an organic light-emitting layer provided between the anode electrode and the cathode electrode, provided in each of the aperture areas above the anode electrodes in the bank; and a charge functional layer commonly provided for each of a plurality of the organic light-emitting layers across the aperture areas, the charge functional layer being provided between the cathode electrode and the bank, a power line which is provided in the peripheral region and provides power to the cathode electrode, wherein the n-type TFT includes a source electrode electrically connected to the anode electrode, the organic light-emitting layer emits light when current corresponding to a voltage between a gate electrode and the source electrode of the n-type TFT flow in a light-emitting period via the anode electrodes to the cathode electrode, a distance from a center of the display region to an end of the cathode electrode is shorter than a distance from the center of the display region to an end of the charge functional layer, and the cathode electrode receives power from the power line at least via the charge functional layer.

In other words, in the organic EL display panel according to an aspect of the present invention, when the driving TFT of the organic light-emitting element is an n-type TFT and when the common electrode is a cathode electrode, a distance from the center of the display region to the end of the cathode electrode is shorter than a distance from the center of the display region to the end of the charge functional layer, and the cathode electrode receives power from the power line via at least the charge functional layer.

With this, it is possible to remove a region in which the cathode electrode and the auxiliary wiring are directly connected to each other in the peripheral region of the display region. Therefore, in the peripheral region of the display region, a current does not flow between the cathode electrode and the auxiliary wiring not via the charge functional layer. In other words, the current flows between the cathode electrode and the auxiliary wiring via the contact resistance by the charge functional layer. Here, the contact resistance by the charge functional layer is resistance which is generated at a portion in which the auxiliary wiring and the charge functional layer are connected to each other. Therefore, it is possible to unify a current path from each pixel to the auxiliary wiring in the central region and the peripheral region of the display region, and it is possible to equalize the potential difference of the cathode voltage (VEE) which is generated in the central region and the peripheral region of the display region.

Accordingly, when the n-type TFT is used as the driving TFT of the organic light-emitting element and when the cathode electrode is used as the common electrode, it is possible to improve the unevenness of voltage distribution of the cathode electrode as the common electrode. Therefore, the contraction rate of the potential difference set in the capacitor by a shift from the write period to the light-emitting period can be even in the display region and degradation in display quality can be reduced.

Moreover, favorably, the cathode electrode receives power from the power line in a whole region of the cathode electrode at least via the charge functional layer.

Moreover, favorably, a parasitic capacitance exists between the gate electrode of the n-type TFT and a drain electrode of the n-type TFT.

In the case of a shift from the write period to the light-emitting period, the potential of the other electrode of the capacitor is further increased by an increase in potential of the cathode voltage (VEE) in the peripheral region than in the central region of the display region. Meanwhile, due to the parasitic capacitance between the gate electrode of the n-type TFT and the drain electrode of the n-type TFT, an increase in one of the electrode potentials in the capacitor is reduced.

Accordingly, a phenomenon occurs that the potential difference set in the capacitor is compressed by the shift from the write period to the light-emitting period.

Moreover, favorably, the power line is electrically connected to the auxiliary wiring arranged in the peripheral region of the display region, the auxiliary wiring arranged in the peripheral region of the display region is connected to the auxiliary wiring arranged in the display region via below the bank located adjacent to a boundary between the display region and the peripheral region of the display region, and the cathode electrode is connected to the auxiliary wiring arranged in the display region via the charge functional layer.

Moreover, favorably, the auxiliary wiring arranged in the peripheral region of the display region is not directly connected to the cathode electrode in the peripheral region of the display region.

According to the present aspect, the auxiliary wiring arranged in the peripheral region of the display region is not directly connected to the cathode electrode in the peripheral region of the display region.

Therefore, the voltage of the cathode electrode in the peripheral region of the display region and the voltage of the cathode electrode in the display region are both a voltage via the charge functional layer and corresponding to the voltage set in the auxiliary wiring. Accordingly, the unevenness in voltage distributions of the cathode electrode as the common electrode can be reduced and degradation in display quality can be prevented.

Moreover, favorably, an expression of $R_{cont(EDGE)} + R_{CAT} \geq R_{cont(pix)} + R_{BUS}$ is satisfied where $R_{cont(pix)}$ represents contact resistance between the cathode electrode and the auxiliary wiring per unit area in a central region of the display region, $R_{cont(EDGE)}$ represents contact resistance between the cathode electrode and the auxiliary wiring per unit area in a peripheral region of the display region, $R_{CAT}$ represents resistance of the cathode electrode, and $R_{BUS}$ represents resistance of the auxiliary wiring.

With this, a current flowing through a pixel in the display region flows more preferentially in the auxiliary wiring that is low resistance than the cathode electrode that is high resistance. Therefore, the amount of voltage drop by the resistance is reduced and the voltage distribution of the cathode electrode is equalized. With this, the display unevenness in the display region can be reduced.

Moreover, favorably, the anode electrodes and the auxiliary wiring are provided in a same layer above the insulating layer.

Moreover, favorably, the end portion of the cathode electrode and the end portion of the charge functional layer extend to above the bank located adjacent to the boundary between the display region and the peripheral region of the display region.

Moreover, favorably, the bank comprises an organic material, and has a surface on which a liquid repellent process is performed.

Moreover, favorably, the bank comprises an organic material having liquid repellency.

When the organic light-emitting layer is formed according to an application method, the bank does not perform a function of partitioning the pixels unless the surface of the bank partitioning the pixels has liquid repellency. Therefore, the bank comprises an organic material having liquid repellency.

Moreover, favorably, the charge functional layer includes at least an electron transport layer or an electron injection layer.

Moreover, an organic EL display apparatus includes the organic EL display panel.

Moreover, an organic EL display panel according to another aspect of the present invention comprises: a plurality of anode electrodes arranged in a display region located above a substrate; an auxiliary wiring which is arranged in a peripheral region of the display region and in the display region and is arranged separately from the anode electrodes in the display region; a bank in which a plurality of aperture areas are provided above the anode electrodes or the auxiliary wiring in the display region; a cathode electrode provided above the bank and provided above the anode electrodes; an organic light-emitting layer provided between the anode electrodes and the cathode electrode, and provided in each of the aperture areas above the anode electrodes in the bank; a charge functional layer commonly provided for each of a plurality of the organic light-emitting layers across the aperture areas, the charge functional layer being provided between the cathode electrode and the bank; and a power line which is provided in the peripheral region and provides power to the cathode electrode, wherein a distance from a center of the display region to an end of the cathode electrode is shorter than a distance from the center of the display region to an end of the charge functional layer, and the cathode electrode receives power from the power line at least the charge functional layer.

It should be noted that a favorable example of the organic EL display panel according to an aspect of the present invention can be applied to an organic EL display panel according to another aspect of the present invention, and it is possible to combine the organic EL display panel according to another aspect of the present invention with the favorable example where appropriate.

(Path to Arriving at Present Invention)

Ahead of the description of embodiments of the present invention, the path to arriving at the present invention and problems to be solved by the present invention will be described in detail.

As described above, in the above described conventional technique A, the light-emitting functional layer has a configuration where all or some of an organic EL substance (organic light-emitting layer), a hole injection layer, a hole transport layer, an electron transport layer, an electron injection layer, a hole block layer, and an electron block layer are included, and patterning is performed on each of the light-emitting elements. Accordingly, a process of performing patterning on each of the layers included in the light-emitting functional layer is necessary, and a facility is required for performing the process, a manufacturing process is complicated, thereby generating a high cost.

If the charge functional layer comprising, for example, at least one of the electron transport layer and the electron injection layer as the charge functional layer that are included in the organic light-emitting layer is commonly formed across each of the light-emitting elements, the process of performing patterning on the charge functional layer of each of the light-emitting elements can be removed, a manufacturing process can be simplified, and a cost can be reduced.

Figure 18:
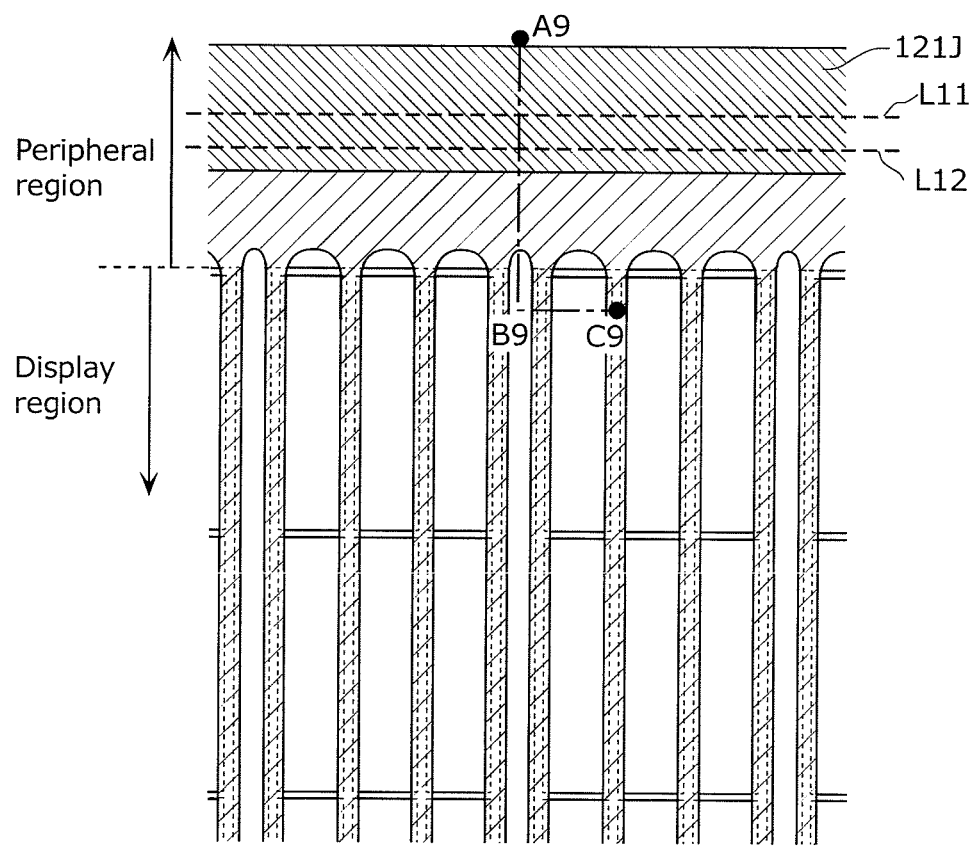
FIG. 18 is a diagram illustrating an enlarged configuration of a region adjacent to an end portion of a display region of an organic EL display panel.

FIG. 18 is a diagram illustrating an enlarged configuration of a region adjacent to an end portion of a display region of an organic EL display panel.

Figure 19:
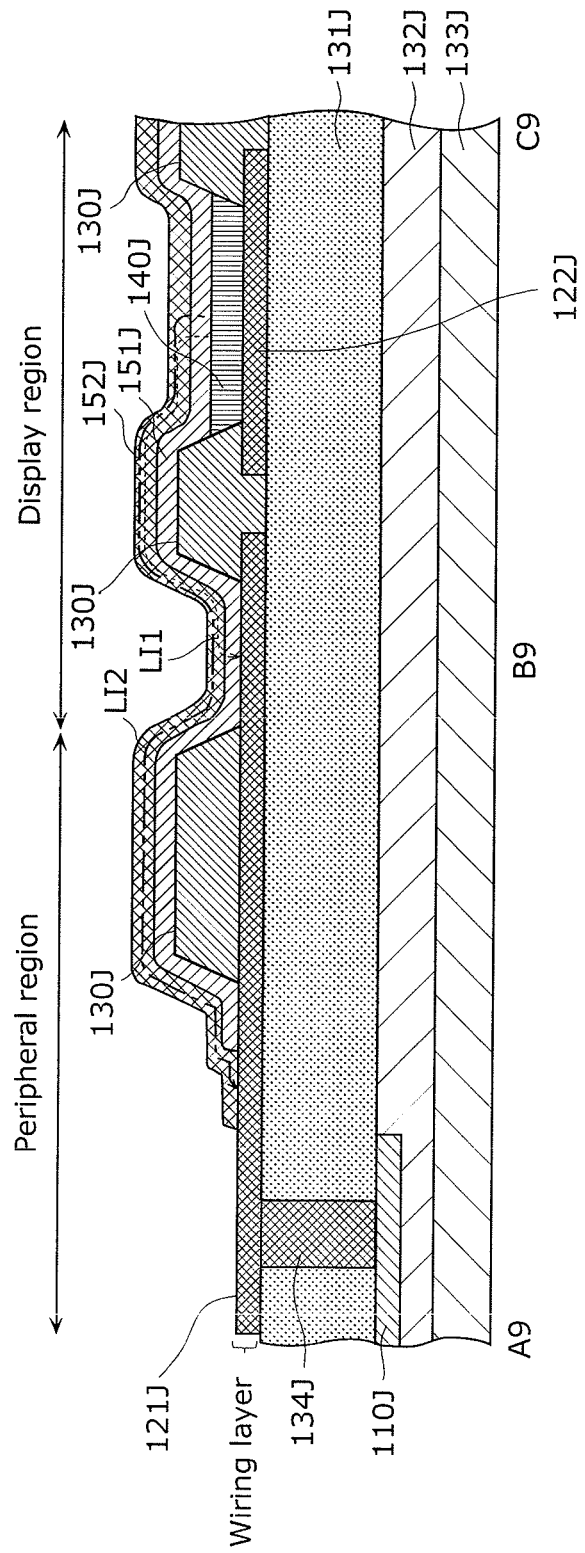
FIG. 19 is a diagram illustrating a configuration where a charge functional layer is commonly formed across each of the light-emitting elements.

FIG. 19 is a diagram illustrating a configuration where a charge functional layer is commonly formed across each of the light-emitting elements. FIG. 19 is a cross-sectional view of a region adjacent to the end portion of the display region illustrated in FIG. 18. Specifically, FIG. 19 is a cross-sectional view of a region adjacent to the end portion of the display region, along the line A9-C9 illustrated in FIG. 18. The line A9-C9 is a line which goes through the position of B9 in FIG. 18.

In FIG. 19, a TFT layer 132J is formed above a substrate 133J. A power line 110J is provided in the TFT layer 132J. An insulating layer 131J is formed above the TFT layer 132J. An auxiliary wiring 121J, and an anode electrode 122J as a pixel electrode are formed above the insulating layer 131J. This anode electrode 122J is electrically connected to TFT of the TFT layer 132J via a contact hole (not illustrated) formed in the insulating layer 131J. The auxiliary wiring 121J is electrically connected to the power line 110J by a contact plug 134J.

Moreover, a bank 130J is formed above the insulating layer 131J. In the display region as the effective region, an organic light-emitting layer 140J is formed in each of the aperture areas formed in the bank 130J.

A charge functional layer 151J is formed across a plurality of aperture areas formed in the bank 130J. A cathode electrode 152J is formed above the charge functional layer 151J. In other words, the cathode electrode 152J is a common electrode used as a cathode of the light-emitting elements.

The line L11 in FIG. 18 illustrates a position of an end of the cathode electrode 152J in the peripheral region of the display region. The line L12 in FIG. 18 illustrates a position of an end of the charge functional layer 151J in the peripheral region of the display region. In the Description, the peripheral region of the display region is a region out of the display region and a peripheral region of the display region. Hereinafter, the peripheral region of the display region is referred to as only the peripheral region.

In the case of the configuration in FIG. 19, however, in the display region as the effective region, the cathode electrode 152J as the common electrode and the auxiliary wiring 121J are electrically connected to each other at least via the charge functional layer 151J. Meanwhile, in the peripheral region, the cathode electrode 152J is directly connected to the auxiliary wiring 121J that is electrically connected to the power line 110J, not via the charge functional layer 151J.

Even in this case, in the above described technique A, the problem does not occur when a p-type TFT is used as a driving TFT which drives a light-emitting element.

In other words, when the p-type TFT is used as a driving TFT and when the cathode electrode 152J is a common electrode, the drain electrode of the p-type TFT is connected to an organic EL element, and an electrostatic retention capacitance is arranged between the source electrode and the gate electrode of the p-type TFT. In this case, a phenomenon that a voltage of the gate electrode of the driving TFT is simultaneously increased (bootstrap phenomenon) does not occur, when in a switch from the write period to the light-emitting period, the potential of the lower electrode of the organic EL element (anode potential) is increased from an OFF voltage to an ON voltage of the organic EL element.

Therefore, even when a voltage changes in the cathode electrode 152J in a switch from the write period to the light-emitting period, the voltage of the gate electrode of the p-type TFT is not changed, and the current flowing through the organic EL element is not changed.

However, when the n-type TFT is used as a driving TFT which drives a light-emitting element, the bootstrap phenomenon occurs as follows.

Figure 20:
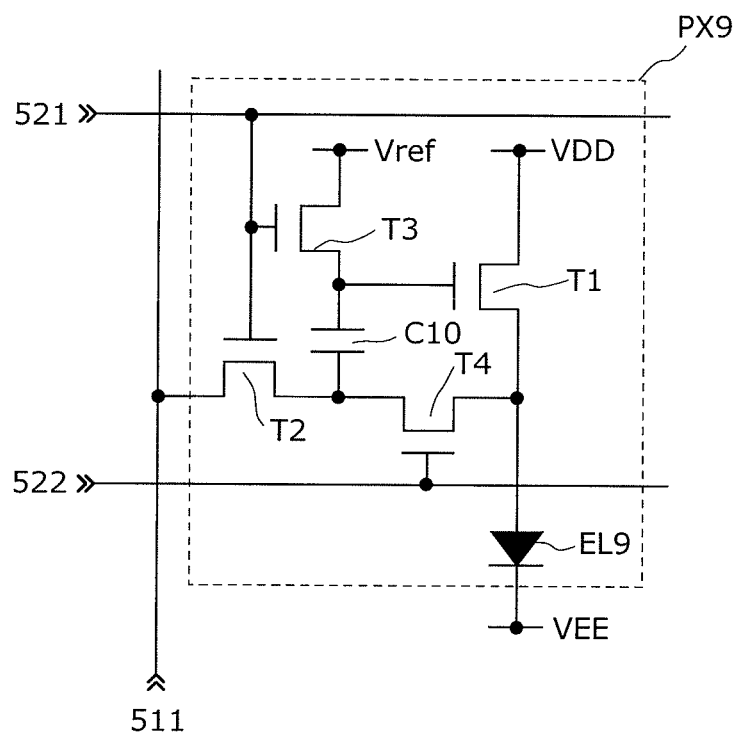
FIG. 20 is a diagram illustrating an example of a circuit configuration of a sub-pixel unit using an n-type TFT.

FIG. 20 is a diagram illustrating an example of a circuit configuration of a sub-pixel unit PX9 using an n-type TFT. The sub-pixel unit PX9 is one of the three sub-pixel units comprising one pixel unit.

As illustrated in FIG. 20, a scanning line 521, a control line 522, and a signal line 511 are provided in association with the sub-pixel unit PX9.

The sub-pixel unit PX9 includes a driving transistor T1, switching transistors T2, T3, and T4, a capacitor C10, a light-emitting element EL9, a cathode power line that is a power on the negative side, and a power line that is a power on the positive side. The cathode power line provides a cathode voltage VEE. The power line provides a voltage VDD.

The driving transistor T1 is an n-type TFT. In other words, the driving transistor T1 is an n-type driving TFT. The light-emitting element EL9 is an organic EL element.

Figure 17:
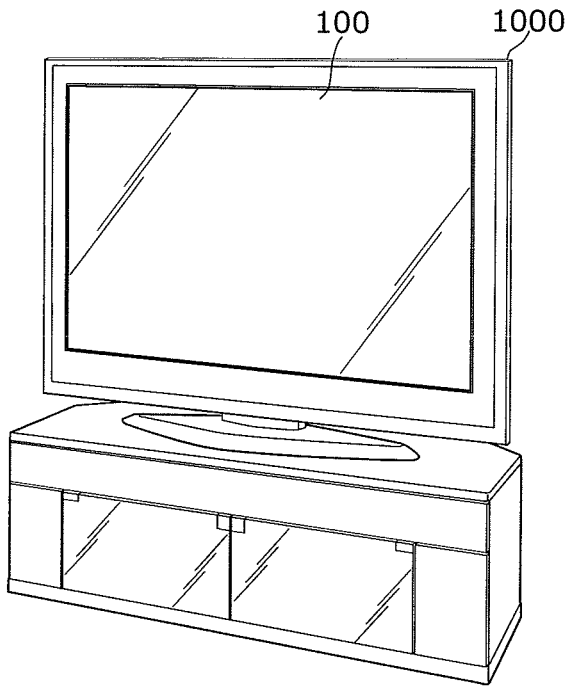
FIG. 17 is an external view of a display apparatus including a display panel.
Figure 21:
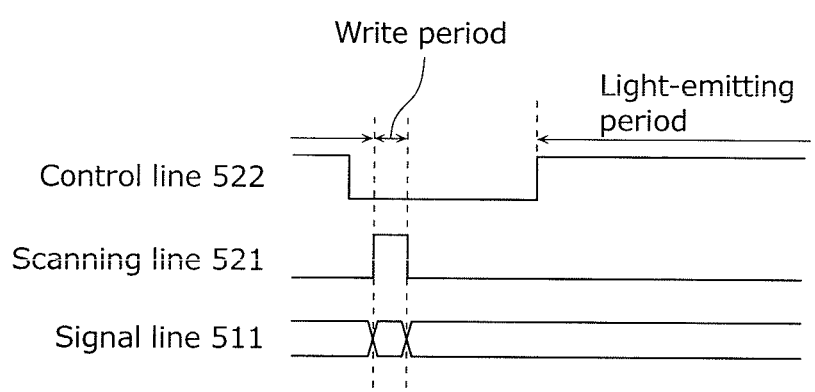
FIG. 21 is a timing chart for explaining an operation of a sub-pixel unit.

FIG. 21 is a timing chart for explaining an operation of a sub-pixel unit PX9. FIG. 17 illustrates a voltage waveform each for the control line 522, the scanning line 521, and the signal line 511.

Figure 22:
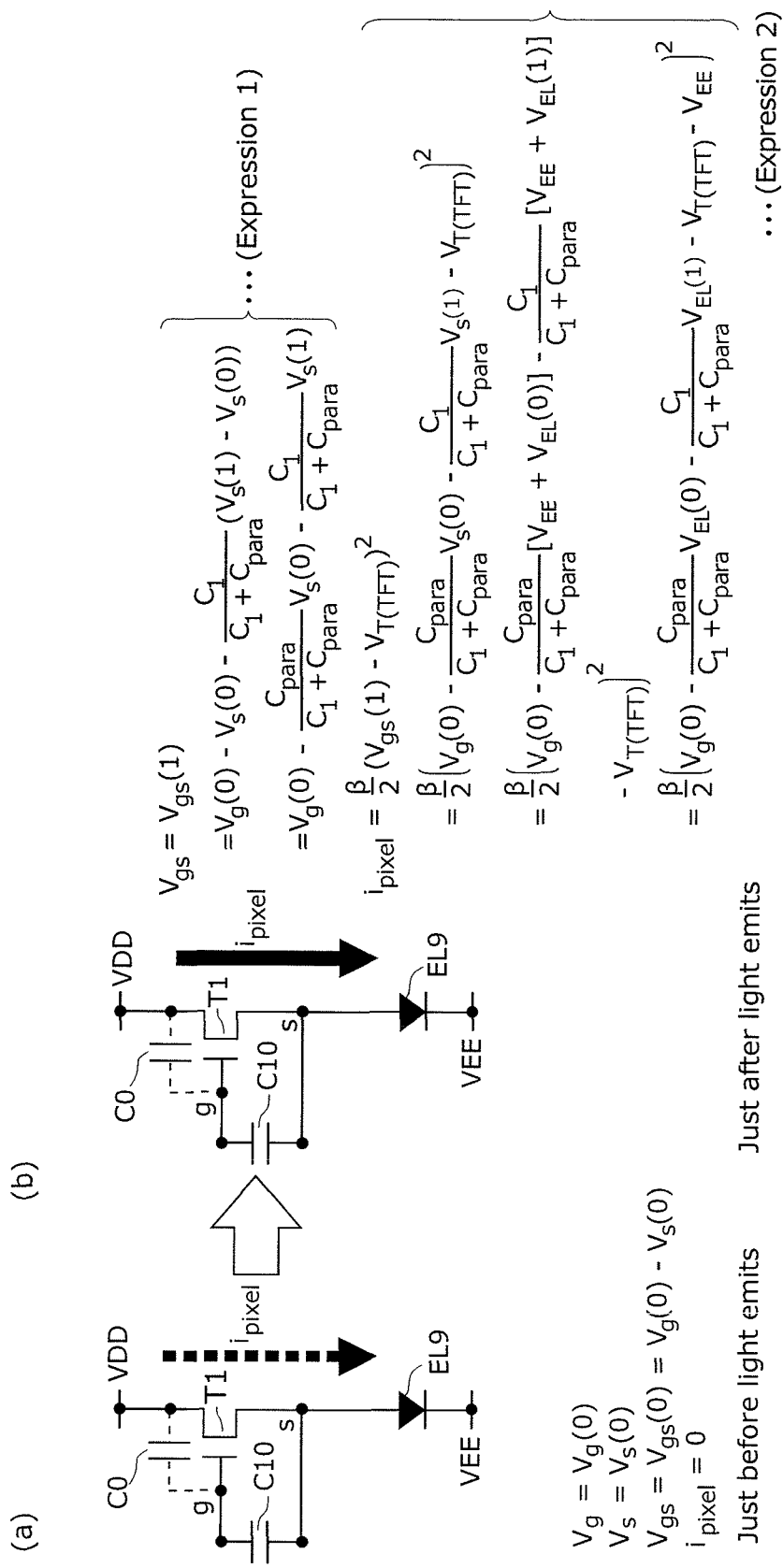
FIG. 22 (a)-(b) is a diagram for explaining an operation of a sub-pixel unit.

FIG. 22 is a diagram for explaining an operation of a sub-pixel unit PX9.

With reference to FIGS. 20 to 22, the source electrode of the driving transistor T1 is OFF since the cathode voltage (VEE) is not changed in the write period in which a potential difference is set in the capacitor C10 in the sub-pixel unit PX9 as a driving circuit (refer to FIG. 21 and (a) in FIG. 22).

In (a) in FIG. 22, Vg (0) is a gate voltage of the driving transistor T1 just before light starts to emit. Vs (0) is a source voltage of the driving transistor T1 just before light starts to emit. Vgs (0) is a gate-source voltage of the driving transistor T1 just before light starts to emit.

An anode voltage of the organic EL element increases when the organic light-emitting layer 140J is shifted to a light-emitting period for causing the organic light-emitting layer 140J to emit light based on a current corresponding to the potential difference set in the capacitor C10. Based on this, the potential Vs of the other electrode of the capacitor C10 connected to the organic EL element is increased.

In this case, a gate-source voltage of the driving transistor T1 just before light starts to emit becomes Vgs as shown in Expression 1. Moreover, a pixel current $i_{pixel}$ of the driving transistor T1 is a value as shown in Expression 2

[Math. 1]

$$\begin{aligned} V_{gs} &= V_{gs}(1) \\ &= V_g(0) - V_s(0) - \frac{C_1}{C_1 + C_{para}}(V_s(1) - V_s(0)) \\ &= V_g(0) - \frac{C_{para}}{C_1 + C_{para}}V_s(0) - \frac{C_1}{C_1 + C_{para}}V_s(1) \end{aligned}$$ (Expression 1)

In Expression 1, $C_{para}$ is a value obtained by subtracting a capacitance component between the gate and source electrodes of the driving transistor T1 (including the parasitic capacitance of the driving transistor T1) from all capacitance components connected to the gate electrode of the driving transistor T1, including the parasitic capacitance C0 of the driving transistor T1. $C_1$ denotes a capacitance of the capacitor C10 that is a capacitance component. Vgs (1) is a gate-source voltage of the driving transistor T1 when light emits. Vs (1) is a source voltage of the driving transistor T1 when light emits.

[Math. 2]

$$\begin{aligned} i_{pixel} &= \frac{\beta}{2}(V_{gs}(1) - V_{T(TFT)})^2 \\ &= \frac{\beta}{2}\left(\frac{V_g(0) - \frac{C_{para}}{C_1 + C_{para}}V_s(0) -}{\frac{C_1}{C_1 + C_{para}}V_s(1) - V_{T(TFT)}}\right)^2 \\ &= \frac{\beta}{2}\left(\frac{V_g(0) - \frac{C_{para}}{C_1 + C_{para}}[V_{EE} + V_{EL}(0)] -}{\frac{C_1}{C_1 + C_{para}}[V_{EE} + V_{EL}(1)] - V_{T(TFT)}}\right)^2 \\ &= \frac{\beta}{2}\left(\frac{V_g(0) - \frac{C_{para}}{C_1 + C_{para}}V_{EL}(0) -}{\frac{C_1}{C_1 + C_{para}}V_{EL}(1) - V_{T(TFT)} - V_{EE}}\right)^2 \end{aligned}$$ (Expression 2)

In (b) in FIG. 22 and Expression 2, $V_{T(TFT)}$ is a threshold voltage of the driving transistor T1. Moreover, $V_{EE}$ corresponds to VEE. Vs (1) is a voltage obtained by adding, to VEE, an ON voltage of the light-emitting element EL9 corresponding to the pixel current $i_{pixel}$. From Expression 2, it turns out that the pixel current $i_{pixel}$ is a function of VEE. In other words, when in the display region, the cathode voltage (VEE) of each of the light-emitting elements EL9 greatly changes according to a position of a pixel including the light-emitting element EL9, a change in the pixel current $i_{pixel}$ flowing through the light-emitting element EL9 is also greater (refer to (b) in FIG. 22). In this case, variation occurs in the light-emitting amount of each of the light-emitting elements EL9 in the display region.

Meanwhile, an increase in a potential of one of the electrodes in the capacitor C10 connected to the gate electrode of the driving transistor T1 is reduced by the capacitance component connected to the gate electrode of the driving transistor T1 which includes the parasitic capacitance C0 between the gate electrode of the driving transistor T1 and the drain electrode of the driving transistor T1. Accordingly, a phenomenon occurs that the potential difference in the light-emitting period is compressed compared with the potential difference set in the capacitor C10 in the write period, by the shift from the write period to the light-emitting period. This contraction amount depends on the cathode voltage (VEE) as illustrated in Expression 2. Therefore, when the increase in the cathode voltage (VEE) is even in the display region, a contraction rate of the potential difference set in each of the capacitors C10 in the display region is almost equal. This means that an impact on display variations is small.

However, since in the display region as the effective region, the auxiliary wiring 121J is electrically connected to the cathode electrode 152J at least via the charge functional layer 151J, contact resistance is generated by the charge functional layer 151J. Meanwhile, in the peripheral region of the display region, the auxiliary wiring 121J is directly connected to the cathode electrode 152J as the common electrode without the interposition of the charge functional layer 151J. Therefore, contact resistance is not generated by the charge functional layer 151J.

As described above, in FIG. 19, in the display region, contact resistance is generated by the interposition of the charge functional layer 151J between the cathode electrode 152J as the common electrode and the auxiliary wiring 121J. Meanwhile, in the peripheral region of the display region, contact resistance is not generated since the cathode electrode 152J as the common electrode and the auxiliary wiring 121J are directly connected to each other.

Figure 23:
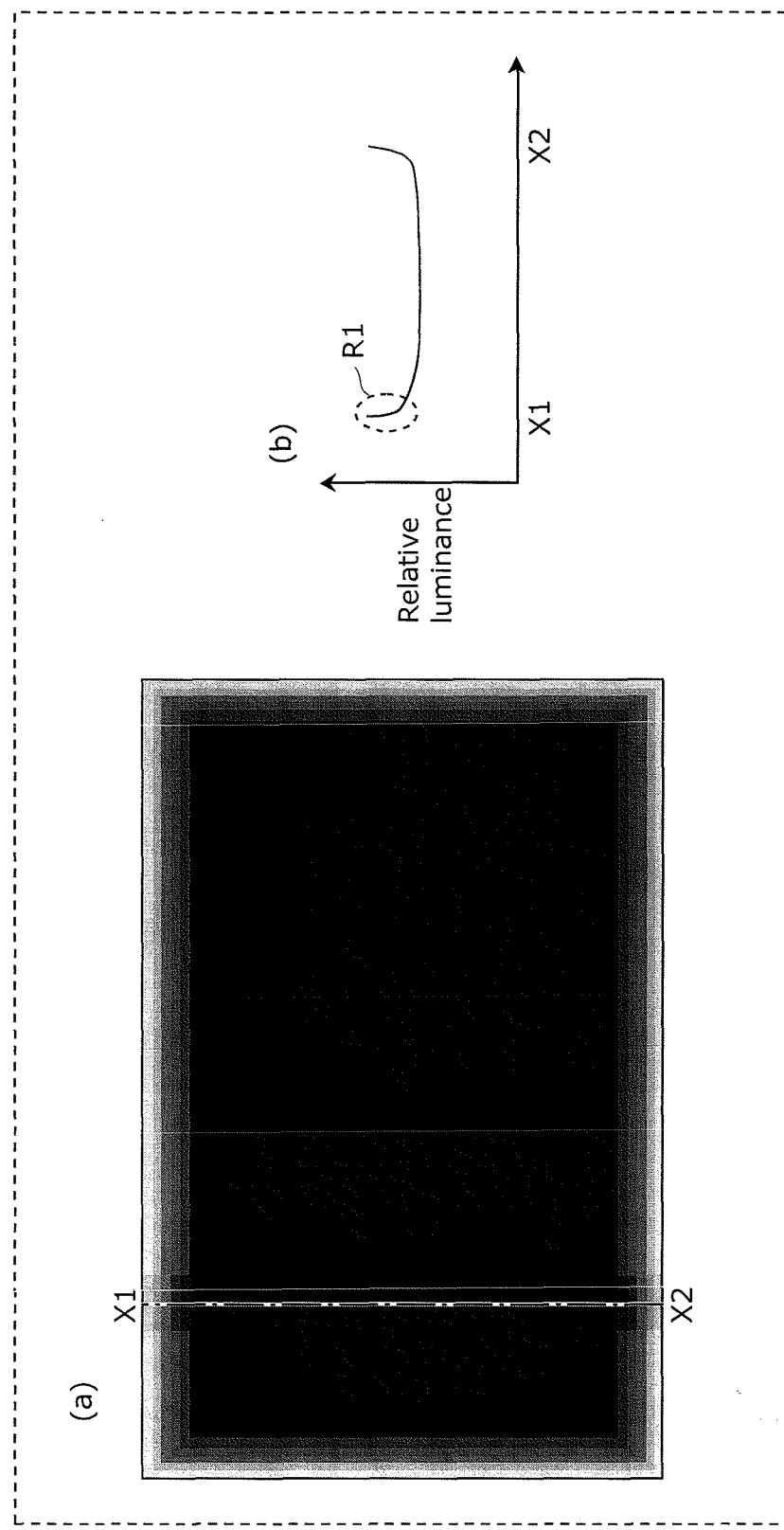
FIG. 23 (a)-(b) is a diagram for explaining a state of luminance in a display region.

Therefore, in the configuration of FIG. 19, a rate of increase in the cathode voltage (VEE) of the light-emitting element EL9 is low especially in the peripheral region of the display region and is high in the central region. In the Description, the peripheral region of the display region is a region in the display region and a region of the end portion of the display region. Therefore, the compression rate of the potential difference set in the capacitor C10 is higher in the central region than in the peripheral region. Accordingly, as illustrated in (a) and (b) in FIG. 23, the display luminance is rapidly decreased from the peripheral region to the central region (for example, region R1 in (b) in FIG. 23), and an impact on display variations is greater. (a) in FIG. 23 is a diagram illustrating a state of luminance (relative luminance) in the display region. (b) in FIG. 23 is a diagram illustrating a state of luminance (relative luminance) along the line X1-X2 in (a) in FIG. 23.

Therefore, this means that the amount of current flowing between the auxiliary wiring 121J and the cathode electrode 152J as the common electrode in the peripheral region of the display region as the effective region is relatively greater than the amount of current flowing between the auxiliary wiring 121J and the cathode electrode 152J in the display region. In other words, in FIG. 19, the amount of current flowing through a current path LI2 in the peripheral region is relatively greater than the amount of current flowing through a current path LI1.

Accordingly, more current is flowing in the peripheral region of the display region than in a region adjacent to the center of the display region, unevenness is generated in voltage distribution of the cathode electrode 152J as the common electrode, and there is a problem that display unevenness (degradation in display quality) is generated in the display region. The present invention is conceived in view of this problem.

The following will describe embodiments of the present invention with reference to the drawings. The same reference signs are assigned to the same structural elements in the following description. The names and the functions are the same. Therefore, a detail description will be omitted thereof.

Here, the sizes, materials, shapes, the relative arrangement of the structural elements etc. shown in the following exemplary embodiments are changed where appropriate according to the configuration of an apparatus and conditions in the present invention, and therefore the scope of the present invention is not limited to the examples. The sizes of the structural elements in the drawings are different from the real sizes.

<Embodiment 1>

FIG. 1 is a block diagram illustrating a configuration of a display apparatus 1000 according to Embodiment 1 of the present invention. As illustrated in FIG. 1, the display apparatus 1000 includes a display panel 100, a scanning line driving circuit 200, and a data line driving circuit 300.

The display panel 100 is an organic electroluminescence (EL) panel using organic EL elements that are organic light-emitting elements. In other words, the display apparatus 1000 including the display panel 100 that is an organic EL display panel is an organic EL display apparatus.

The display panel 100 is an active-matrix display panel which includes a thin-film transistor of each pixel unit. The display panel 100 is a top-emission display panel. It should be noted that the display panel 100 may be a bottom-emission display panel.

The display panel 100 includes a display region R10 to display an image. The display region R10 is formed above a substrate 133 to be described later.

Figure 2:
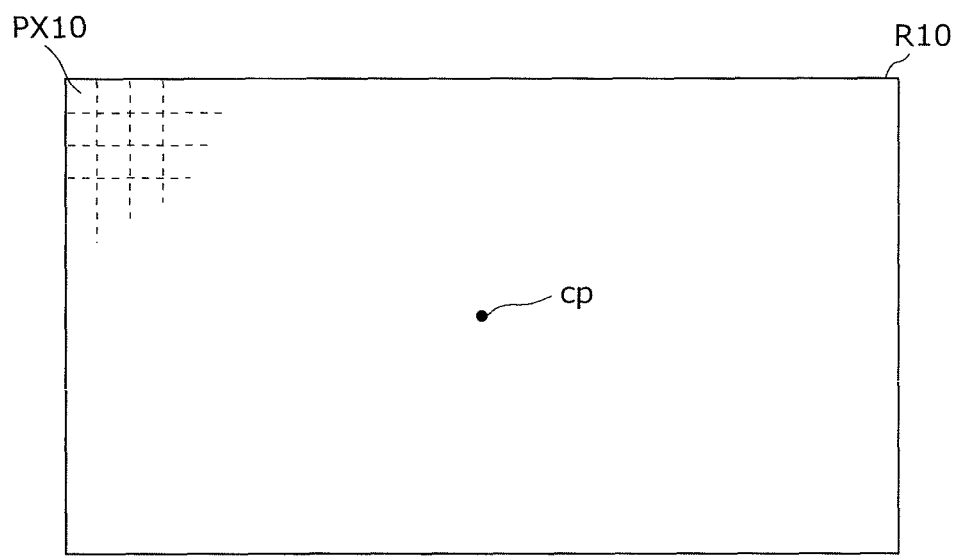
FIG. 2 is a diagram illustrating a configuration of a display region.

FIG. 2 is a diagram illustrating a configuration of the display region R10. In FIG. 2, a position CP is a center of the display region R10.

A plurality of pixel units PX10 are arranged in the display region R10 of the display panel 100. In other words, the display panel 100 includes the pixel units PX10. The pixel units PX10 are arranged in rows and columns. Each of the pixel units PX10 emits light according to a signal provided from outside.

Figure 3:
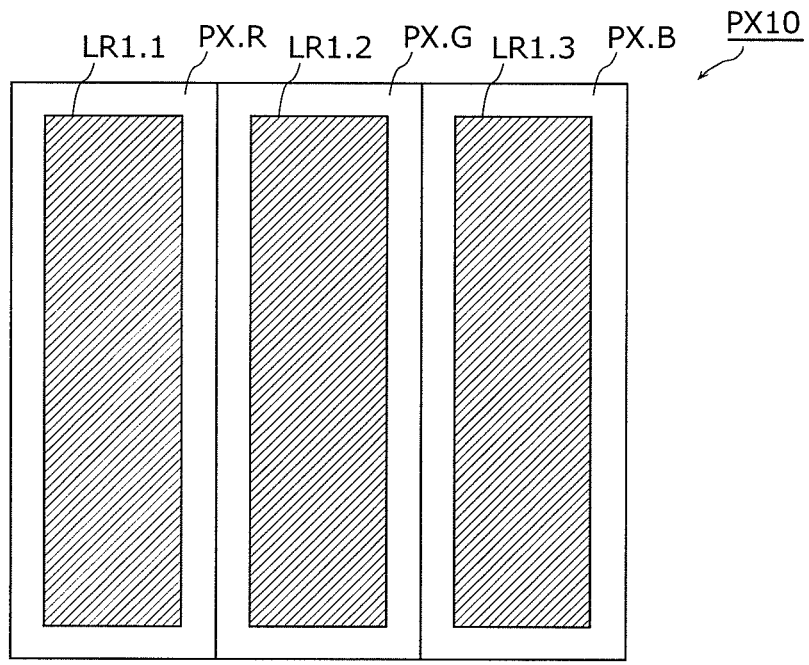
FIG. 3 is a diagram illustrating an example of a configuration of a pixel unit.

FIG. 3 is a diagram illustrating an example of a configuration of the pixel unit PX10.

As illustrated in FIG. 3, the pixel unit PX10 comprises sub-pixel units PX.R, PX.G, and PX.B. Sub-pixel units PX.R, PX.G, and PX.B are pixel units which emit lights of red, green, and blue, respectively.

The sub-pixel units PX.R, PX.G, and PX.B include light-emitting regions LR1.1, LR1.2, and LR1.3, respectively. The light-emitting regions LR1.1, LR1.2, and LR1.3 are regions which emit lights of red, green, and blue, respectively.

Hereinafter, each of the sub-pixel units PX.R, PX.G, and PX.B is also referred to as the sub-pixel unit PX. Hereinafter, each of the light-emitting regions LR1.1, LR1.2, and LR1.3 is also referred to as the light-emitting region LR1.

It should be noted that the pixel unit PX10 is not limited to the sub-pixel units of the three primary colors of red, green, and blue (RGB). For example, the pixel unit PX10 may be comprised with the four primary colors such as red, green, blue, and white (RGBW) and red, green, blue, and yellow (RGBY), as well as more primary colors. For example, it is acceptable that the pixel unit PX10 may comprise sub-pixel units of PenTile arrangement that is arranged in matrix by combining RG and BG into one unit cell.

Figure 4:
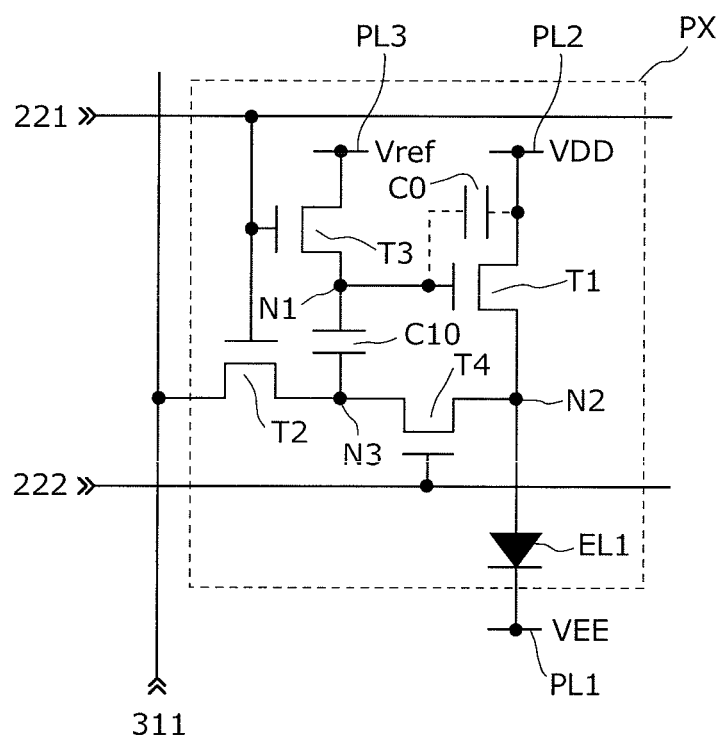
FIG. 4 is a diagram illustrating an example of a circuit configuration of a sub-pixel unit.

FIG. 4 is a diagram illustrating a circuit configuration of the sub-pixel unit PX.

As illustrated in FIG. 4, a scanning line 221, a control line 222, and a signal line 311 are provided in association with the sub-pixel unit PX.

The sub-pixel unit PX includes the driving transistor T1, switching transistors T2, T3, and T4, the capacitor C10, and the light-emitting element EL1.

The driving transistor T1 is an n-type thin-film transistor (TFT).

The switching transistors T2, T3 and T4 are each an n-type thin-film transistor (TFT). It should be noted that each of the switching transistors T2, T3 and T4 is not limited to an n-type TFT, and each of the switching transistors T2, T3, and T4 may be a p-type TFT.

The light-emitting element EL1 is an organic EL element. The organic EL element emits brighter light when current provided to the organic EL element is greater.

The following will describe that binary high voltage state and low voltage state of a signal and a signal line are also referred to as H level and L level, respectively. The following will describe that the gate electrode, the drain electrode, and the source electrode of each transistor are referred to as gate, drain, and source, respectively.

As illustrated in FIG. 4, the gate of each of the switching transistors T2 and T3 is electrically connected to the scanning line 221.

One of the drain and the source of the switching transistor T2 is connected to the signal line 311. The other of the drain and the source of the switching transistor T2 is connected to a node N3.

One of the drain and the source of the switching transistor T3 is connected to a power line PL3. The power line PL3 provides a reference voltage Vref. The other of the drain and the source of the switching transistor T3 is connected to a node N1. The capacitor C10 is provided between the node N1 and the node N3.

The gate of the switching transistor T4 is connected to the control line 222. One of the drain and the source of the switching transistor T4 is connected to the node N3. The other of the drain and the source of the switching transistor T4 is connected to a node N2.

The gate of the driving transistor T1 is connected to the node N1. The drain of the driving transistor T1 is connected to a power line PL2 which provides a voltage VDD that is a high power. The source of the driving transistor T1 is connected to the node N2. A parasitic capacitance C0 exists between the gate electrode of the n-type driving transistor T1 and the drain electrode of the n-type driving transistor T1.

An anode of the light-emitting element EL1 is connected to the node N2. A cathode of the light-emitting element EL1 is connected to the power line PL1 which provides a voltage VEE (cathode voltage) that is a low power.

The scanning line 221, the control line 222, and the signal line 311 are provided in association with each of the sub-pixel units included in the display panel 100. In other words, the display panel 100 includes the scanning lines 221, the control lines 222, and the signal lines 311.

With reference to FIGS. 1 and 4, the scanning line driving circuit 200 is connected to the display panel 100 via connectors 210. The scanning line driving circuit 200 is connected to the scanning lines 221 and the control lines 222 via the connectors 210. The scanning line driving circuit 200 controls the scanning lines 221 and the control lines 222.

The data line driving circuit 300 is connected to the display panel 100 via connectors 310. The data line driving circuit 300 is connected to the signal lines 311 via the connectors 310. The data line driving circuit 300 controls the signal lines 311.

Figure 5:
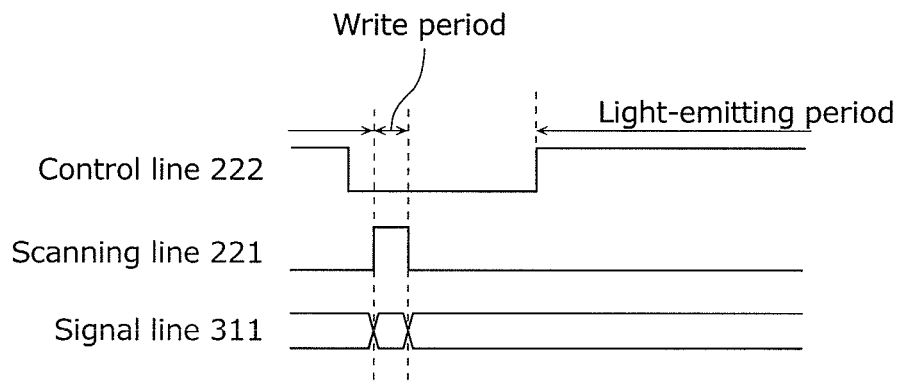
FIG. 5 is a timing chart for explaining an operation of a sub-pixel unit according to Embodiment 1 of the present invention.

FIG. 5 is a timing chart for explaining an operation of the sub-pixel unit PX according to Embodiment 1 of the present invention. FIG. 5 illustrates a voltage waveform of each of the control line 222, the scanning line 221, and the signal line 311.

In the write period, by controlling the control line 222, the scanning line 221, and the signal line 311 which correspond to the sub-pixel unit PX as illustrated in the waveforms in FIG. 5, a data voltage is written from the signal line 311 to the capacitor C10. This data voltage is a voltage to determine a current which flows through the light-emitting element EL1 in the light-emitting period.

In the light-emitting period, in the control line 222 and the scanning line 221 which correspond to the sub-pixel unit PX, the control line 222 becomes H level, and the switching transistor T4 becomes an ON state, as illustrated in the waveform in FIG. 5. Accordingly, the data voltage is applied between the gate and the source of the transistor T1, and the current corresponding to the data voltage flows. With this, the light-emitting element EL1 emits light.

With reference to FIG. 1 again, a ring-shaped power line 110 is provided in the surround region of the display region R10. In the Description, the surround region of the display region R10 is a region out of the display region R10.

The power line 110 is provided in the peripheral region of the display region R10.

In the display region R10, auxiliary wirings 121 are arranged in a grid. The auxiliary wiring 121 comprises a conductive material. The auxiliary wirings 121 are electrically connected to the power line 110. Each of the auxiliary wirings 121 is an electrode to reduce a voltage drop of the power line PL1 which provides the voltage VEE in the central portion of the display region R10.

It should be noted that for simplification of the drawing, FIG. 1 does not illustrate the auxiliary wiring 121 which is arranged in the peripheral region of the display region R10.

Figure 6A:
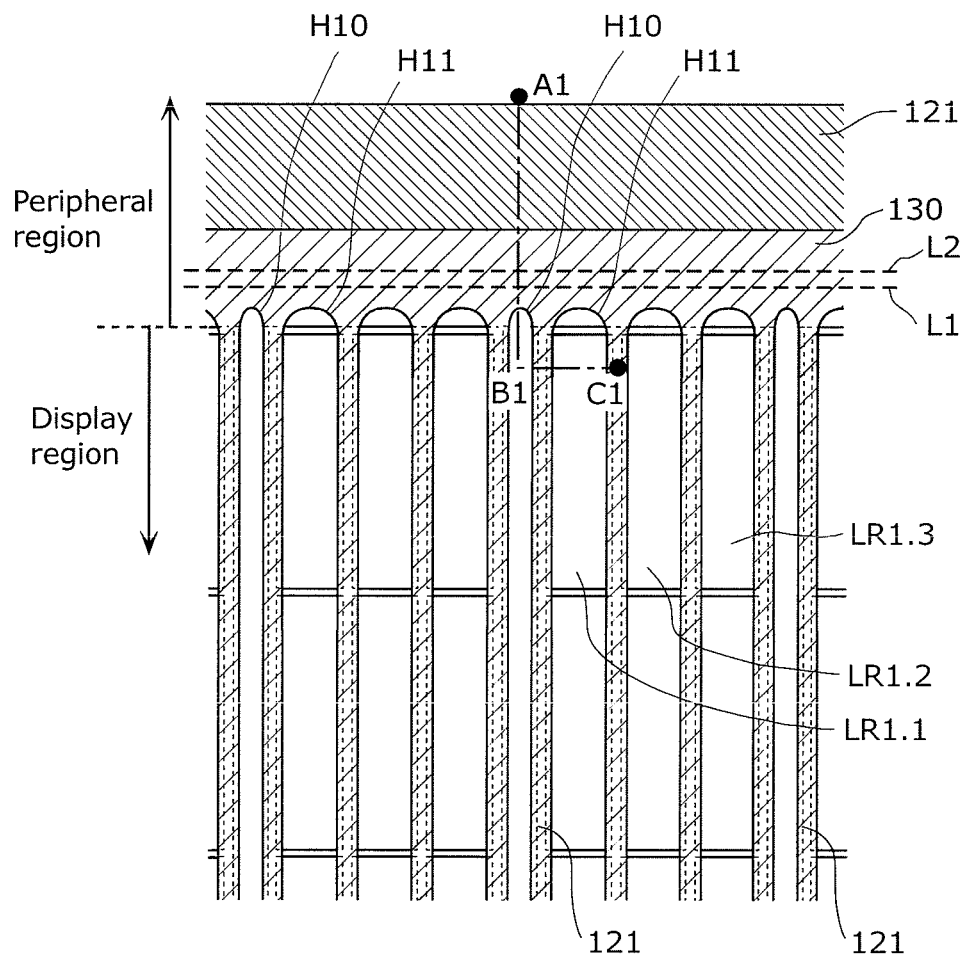
FIG. 6A is a diagram illustrating an enlarged configuration of a region adjacent to an end portion of a display region.

FIG. 6A is a diagram illustrating an enlarged region R20 located adjacent to the end portion of the display region R10. The region R20 is a region illustrated in FIG. 1.

For simplification of the drawing, FIG. 6A does not illustrate the auxiliary wiring 121 and the cathode electrode 152 to be described later that are arranged along a horizontal direction in the display region.

Between the two auxiliary wirings 121 adjacent to each other in a horizontal direction in FIG. 6A, the pixel units PX10 lined up in a vertical direction are arranged. Each of the pixel units PX10 comprises sub-pixel units PX.R, PX.G, and PX.B. The light-emitting regions LR1.1, LR1.2, and LR1.3 illustrated in FIG. 6A are the light-emitting regions LR1.1, LR1.2, and LR1.3 in one of the pixel units 10 illustrated in FIG. 3, respectively.

Figure 6B:
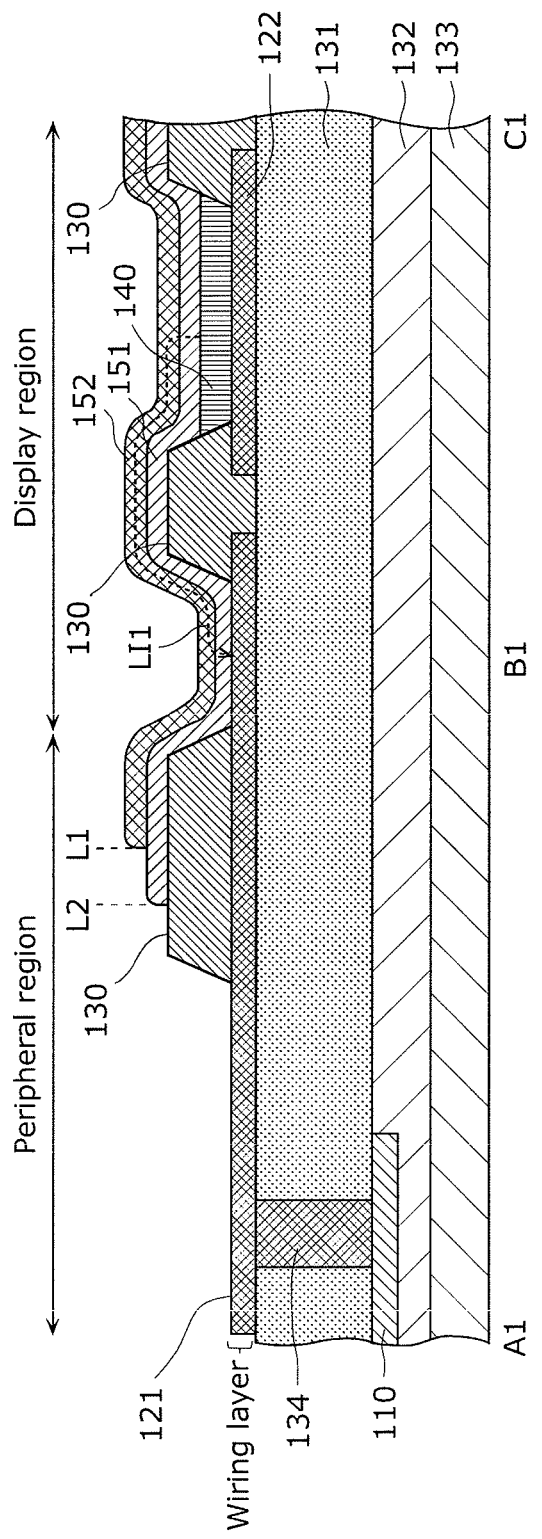
FIG. 6B is a cross-sectional view of part of a display panel according to Embodiment 1 of the present invention.

FIG. 6B is a cross-sectional view of part of the display panel 100 according to Embodiment 1 of the present invention. Specifically, FIG. 6B is a cross-sectional view of a region adjacent to the end portion of the display region R10, along the line A1-C1 illustrated in FIG. 6A. The line A1-C1 is a line which goes through the position of B1 in FIG. 6A. It should be noted that for simplification of the drawing, FIG. 6B does not illustrate structural elements formed above the cathode electrode 152 to be described later in the display region R10 (for example, a resin layer and sealing glass). The non-illustrated resin layer is formed with a high resistance material. For example, the resin layer is formed to cover the cathode electrode 152 to be described later and a portion where the cathode electrode 152 is not formed.

It should be noted that the configurations illustrated in FIGS. 6A and 6B are not a configuration to be applied only to the top end portion of the display region R10 in FIG. 1. The configurations adjacent to the bottom end portion, the left end portion, and the right end portion of the display region R10 are those illustrated in FIGS. 6A and 6B. In other words, the configurations adjacent to the peripheral region of the display region R10 are those illustrated in FIGS. 6A and 6B. The peripheral region of the display region R10 is a region in the display region R10 and a region of the end portion of the display region R10.

As illustrated in FIG. 6B, the display panel 100 includes the substrate 133, the TFT layer 132, the insulating layer 131, the power line 110, the auxiliary wiring 121, the anode electrode 122, the bank 130, the charge functional layer 151, the cathode electrode 152, and the organic light-emitting layer 140.

The TFT layer 132 is formed above the substrate 133. In the TFT layer 132, an element such as a transistor included in each pixel unit PX10 in the display region R10 is formed. In other words, the TFT layer 132 includes the n-type driving transistor T1. In other words, the TFT layer 132 includes the n-type TFT as a driving TFT. The power line 110 is formed in the TFT 132.

The insulating layer 131 is formed above the TFT layer 132.

The anode electrode 122 is an electrode which corresponds to the anode of the light-emitting element EL1. In other words, the anode electrode 122 is the lower electrode of the light-emitting element EL1. The anode electrode 122 is formed above the insulating layer 131. The anode electrode 122 is provided corresponding to each of the sub-pixel units PX in the display region R10. In other words, the anode electrodes 122 are provided in the display region R10 above the insulating layer 131.

Moreover, the auxiliary wiring 121 is formed above the insulating layer 131. The auxiliary wiring 121 is arranged in the peripheral region of the display region R10 and in the display region R10. The auxiliary wiring 121 arranged in the peripheral region of the display region R10 is electrically connected to the power line 110 by the contact plug 134.

It should be noted that the configuration is not limited to that where in the connection between the auxiliary wiring 121 and the power line 110, the auxiliary wiring 121 and the power line 110 are provided in different layers and then are electrically connected to each other by the contact plug 134. For example, the power line 110 and the auxiliary wiring 121 are connected to each other in the same layer. In that case, the auxiliary wiring 121 and the power line 110 are electrically connected to each other by providing another member.

Moreover, the auxiliary wiring 121 is arranged separately from the anode electrodes 122 in the display region R10. In other words, the auxiliary wiring 121 is not directly connected to each of the anode electrodes 122. Each of the anode electrodes 122 is electrically connected to the driving transistor T1 of the each pixel unit PX10 in the TFT layer 132 via a contact hole (not illustrated) formed in the insulating layer 131.

The anode electrode 122 and the auxiliary wiring 121 may be formed in the same layer above the insulating layer 131.

Above the insulating layer 131, the bank 130 is formed to cover at least the end of the anode electrode 122. The bank 130 comprises an organic material. A liquid repellent process is performed on the surface of the bank 130. The liquid repellent process is, for example, is performed using fluorine plasma.

It should be noted that the organic material comprising the bank 130 may have liquid repellency. In this case, the liquid repellent process is not performed on the surface of the bank 130, and the bank 130 comprises an organic material having liquid repellency. The organic material having liquid repellency has a feature of including a fluorine resin, for example. The fluorine resin included in the bank 130 (bank) is not especially limited as long as at least some of the polymer recurring units have a fluorine atom. For example, the fluorine resin includes fluorinated polyolefin resin, fluorinated polyimide resin, and fluorinated polyacrylic resin.

Aperture areas are formed in the bank 130. Each of the aperture areas, as illustrated in FIG. 6A, is the aperture area H10 or the aperture area H11.

The aperture area H10 exposes the auxiliary wiring 121 just before the charge functional layer 151 is formed. The aperture area H10 is formed above the auxiliary wiring 121.

The aperture area H11 is provided in association with each of the sub-pixel units PX. The aperture area H11 exposes the anode electrode 122 in a process just before the charge functional layer 151 and the organic light-emitting layer 140 are formed. The aperture area H11 is formed above the anode electrode 122. In other words, the aperture areas formed above the anode electrode 122 or the auxiliary wiring 121 in the display region R10 are formed in the bank 130.

The cathode electrode 152 is a common electrode commonly used as a cathode of each of the light-emitting elements EL1 in the display region R10. The cathode electrode 152 is formed above the charge functional layer 151 to be described later. The cathode electrode 152 is commonly formed for each of the sub-pixel units PX in the display region R10. In other words, the cathode electrode 152 is formed opposite to the auxiliary wirings 121 and the anode electrode 122, above the bank 130.

The power line 110 is a wiring to lastly provide the cathode voltage (VEE) to the cathode electrode 152. The power line 110 is provided at least in the peripheral region of the display region R10. In other words, the power line 110 to provide power to the cathode electrode 152 is provided in the peripheral region of the display region R10.

The power line 110 is electrically connected to the auxiliary wiring 121 arranged in the peripheral region of the display region R10 by the contact plug 134. Power (cathode voltage (VEE)) is provided from the power line 110 to the cathode electrode 152, in the display region R10, via the contact plug 134, the auxiliary wiring 121, and the charge functional layer 151. In other words, power is provided from the power line 110 to the cathode electrode 152, in the display region R10, at least via the charge functional layer 151. In other words, power is provided from the power line 110 to the cathode electrode 152, in the whole region of the cathode electrode 152, at least via the charge functional layer 151.

Moreover, as illustrated in FIG. 6B, the auxiliary wiring 121 arranged in the peripheral region of the display region R10 is connected to the auxiliary wiring 121 arranged in the display region R10 via below the bank 130 located adjacent to a boundary between the display region R10 and the peripheral region of the display region R10. In other words, the portion, of the auxiliary wiring 121, located in the peripheral region of the display region R10 is connected to a portion, of the auxiliary wiring 121, located in the display region R10 via below the bank 130 located adjacent to the boundary between the display region R10 and the peripheral region of the display region R10. The bank 130 located adjacent to the boundary between the display region R10 and the peripheral region of the display region R10 is a portion, of the bank 130, located adjacent to the boundary between the display region R10 and the peripheral region of the display region R10, that is, a portion of the bank 130.

Moreover, the auxiliary wiring 121 arranged in the peripheral region of the display region R10 is not directly connected to the cathode electrode 152 in the peripheral region of the display region R10.

In a position adjacent to B1 in FIG. 6B, the cathode electrode 152 is connected, via the charge functional layer 151, to the auxiliary wiring 121 arranged in the display region R10. It should be noted that the charge functional layer 151 is formed with a high resistance material. Therefore, the current flowing between the power line 110 and the organic light-emitting layer 140 in the sub-pixel unit PX located in the peripheral portion of the display region R10 flows via the current path LI1. In other words, the current needs to go through the charge functional layer 151 having a high resistance. Since the wiring resistance of the auxiliary wiring 121 is set to be smaller than the wiring resistance of the cathode electrode 152, the main factor of potential fluctuation in the cathode electrode 152 is the wiring resistance of the auxiliary wiring 121. This means that the distribution of potentials in the cathode electrode 152 can be significantly equalized.

The organic light-emitting layer 140 is a layer having, as a major component, an organic light-emitting material which emits light by recombination of the hole and the electron. The organic light-emitting layer 140 corresponds to part of the light-emitting element EL1. The organic light-emitting layer 140 is formed in the aperture area H11 corresponding to each of the sub-pixel units PX. The organic light-emitting layer 140 is formed above the anode electrode 122. In other words, the organic light-emitting layer 140 is formed in each of the aperture areas H11 formed in the bank 130. In other words, the organic light-emitting layer 140 is formed in each of the aperture areas H11 formed above the anode electrode 122 in the bank 130 and between the anode electrode 122 and the cathode electrode 152.

The charge functional layer 151 is a layer in which the electron transport layer, the electron injection layer, or the electron transport layer and the electron injection layer are stacked in this order. In other words, the charge functional layer 151 is a high resistance material compared with the anode electrode 122 and the cathode electrode 152 that are conductive layers. In other words, the charge functional layer 151 includes at least the electron transport layer or the electron injection layer.

The charge functional layer 151 is formed to cover the aperture areas formed in the bank 130. In other words, the charge functional layer 151 is formed to cover the upper portion of the organic light-emitting layer 140 corresponding to each of the sub-pixel units PX in the display region R10. In other words, the charge functional layer 151 is commonly formed for the organic light-emitting layers 140 formed in the aperture areas H11. Moreover, the charge functional layer 151 is formed between the cathode electrode 152 and the bank 130. In other words, the charge functional layer 151 is commonly formed, between the cathode electrode 152 and the bank 130, for the organic light-emitting layer 140 across the aperture areas.

Moreover, the source electrode of the n-type driving transistor T1 is electrically connected to the anode of the light-emitting element EL1 (anode electrode 122). In other words, the source electrode of the n-type TFT (driving transistor T1) is electrically connected to the anode electrode 122.

The organic light-emitting layer 140, for example, emits light when the current corresponding to the voltage (Vgs) between the source electrode and the gate electrode of the n-type TFT (driving transistor T1) in the light-emitting period in FIG. 5 flows via the anode electrode 122 to the cathode electrode 152.

Here, Expression 3 is satisfied where $R_{cont(pix)}$ represents the contact resistance between the cathode electrode 152 and the auxiliary wiring 121 per unit area in the central region of the display region R10, $R_{cont(EDGE)}$ represents the contact resistance between the cathode electrode 152 and the auxiliary wiring 121 per unit area in the peripheral region of the display region R10, $R_{CAT}$ represents the resistance of the cathode electrode 152, and $R_{BUS}$ represents the resistance of the auxiliary wiring 121.

$$R_{cont(EDGE)} + R_{CAT} \geq R_{cont(pix)} + R_{BUS} \quad \text{(Expression 3)}$$

$R_{CAT}$ and $R_{BUS}$ in Expression 3 are represented by Expression 4 and Expression 5, respectively.

$$R_{CAT} = R_{(CAT)} \times n \quad \text{(Expression 4)}$$

$$R_{BUS} = R_{(BUS)} \times L_{PIX}/w_{BUS} \times m \quad \text{(Expression 5)}$$

$R_{(CAT)}$ in Expression 4 is a sheet resistance of the cathode electrode 152 as a cathode. The sheet resistance is a value obtained by dividing a resistivity of the cathode electrode 152 by a film thickness of the cathode electrode 152. $R_{(BUS)}$ in Expression 5 is a sheet resistance of the auxiliary wiring 121. The sheet resistance of the auxiliary wiring 121 is a value obtained by dividing the resistivity of the auxiliary wiring 121 by the film thickness of the auxiliary wiring 121.

$L_{PIX}$ is a pixel pitch. In other words, $L_{PIX}$ is a distance between the two adjacent pixel units PX10. Moreover, $w_{BUS}$ is a width in a short direction of the auxiliary wiring 121.

Moreover, when comparison is made between the sheet resistance of the auxiliary wiring 121 and the sheet resistance of the cathode electrode 152, Expression 6 is satisfied to obtain an advantageous effect from providing the auxiliary wiring 121.

$$R_{(CAT)} > R_{(BUS)} \quad \text{(Expression 6)}$$

In other words, a value of the sheet resistance of the cathode electrode 152 is greater than that of the sheet resistance of the auxiliary wiring 121.

Next, n in Expression 4 and m in Expression 5 will be described.

FIG. 7 is a diagram for explaining parts of the expressions related to the cathode electrode 152 and the auxiliary wiring 121. (a) in FIG. 7 is a diagram illustrating a configuration of the power line 110 and the auxiliary wiring 121 according to Embodiment 1. The auxiliary wirings 121 are electrically connected to the power line 110.

Hereinafter, the pixel unit PX10 of the top edge of the display region R10 is referred to as a top edge pixel. Hereinafter, the pixel unit PX10 of the bottom edge of the display region R10 is referred to as a bottom edge pixel. Hereinafter, the pixel unit PX10 of the left edge of the display region R10 is referred to as a left edge pixel. Hereinafter, the pixel unit PX10 of the right edge of the display region R10 is referred to as a right edge pixel. The top edge pixel, the bottom edge pixel, the left edge pixel, and the right edge pixel are each a pixel adjacent to the power line 110.

Hereinafter, the pixel unit PX10 in the display region R10 is referred to as a pixel A.

Hereinafter, the number of pixels (pixel units PX10) arranged from the pixel A to the top edge pixel closest to the pixel A is the number of top pixels. Hereinafter, the number of pixels arranged from the pixel A to the bottom edge pixel closest to the pixel A is the number of bottom pixels. Hereinafter, the number of pixels arranged from the pixel A to the left edge pixel closest to the pixel A is the number of left pixels. Hereinafter, the number of pixels arranged from the pixel A to the right edge pixel closest to the pixel A is the number of right pixels.

In Expression 4, n is the smallest number (integer) among the number of top pixels, the number of bottom pixels, the number of left pixels, and the number of right pixels. In Expression 5, m is the smallest number (integer) among the number of top pixels, the number of bottom pixels, the number of left pixels, and the number of right pixels when counted along from the auxiliary wiring 121 closest to the pixel A to the auxiliary wiring 121. Here, when the pixel A exists in the region R31 in (a) in FIG. 7, m=n.

When Expression 3 is satisfied, the current flowing through a pixel in the display region R10 flows through the auxiliary wiring 121 that is low resistance more preferentially than the cathode electrode 152 that is high resistance. Therefore, the amount of voltage drop is reduced, and the voltage distribution of the cathode electrode 152 is equalized. Accordingly, the display variations in the display region R10 can be reduced.

Hereinafter, the peripheral region of the display region R10 is also referred to as the peripheral region A. The peripheral region A is a region out of the display region R10.

The line L1 in FIGS. 6A and 6B indicates the position of the end of the cathode electrode 152 in the peripheral region A. The line L2 in FIGS. 6A and 6B indicates the position of the end of the charge functional layer 151 in the peripheral region A.

In the present embodiment, as illustrated in FIG. 6B, the end portion of the cathode electrode 152 and the end portion of the charge functional layer 151 are provided above the bank 130 located adjacent to a boundary between the display region R10 and the peripheral region of the display region R10.

Specifically, the end portion of the charge functional layer 151 is provided above the bank 130 located adjacent to a boundary between the display region R10 and the peripheral region of the display region R10. Moreover, the end portion of the cathode electrode 152 is provided above the charge functional layer 151. In other words, the end portion of the cathode electrode 152 is provided above the bank 130 located adjacent to a boundary between the display region R10 and the peripheral region of the display region R10. In other words, the end portion of the cathode electrode 152 and the end portion of the charge functional layer 151 extend to above the bank 130 located adjacent to a boundary between the display region R10 and the peripheral region of the display region R10.

With this, it is possible to remove a region where the cathode electrode 152 and the auxiliary wiring 121 are directly connected to each other in the peripheral region of the display region R10. Therefore, in the peripheral region of the display region R10, a current does not flow between the cathode electrode 152 and the auxiliary wiring 121 not via the charge functional layer 151. In other words, the current flowing between the cathode electrode 152 and the auxiliary wiring 121 mediates contact resistance by the charge functional layer 151.

Here, the contact resistance by the charge functional layer 151 is resistance generated in an interface where the auxiliary wiring 121 and the charge functional layer 151 are connected to each other, resistance generated in an interface where the cathode electrode 152 and the charge functional layer 151 are fixed to each other, and electrical resistance of the charge functional layer 151.

Therefore, by setting the wiring resistance of the auxiliary wiring 121 to be smaller than the wiring resistance of the cathode electrode 152, the main factor for potential fluctuations of the cathode electrode 152 can be the wiring resistance of the auxiliary wiring 121. With this, the potential distribution of the cathode electrode 152 can be significantly equalized, and the difference in the amount of current between the central region and the peripheral region in the display region R10 can be small.

Accordingly, when an n-type TFT is used as a driving TFT of the organic light-emitting element (light-emitting element EL1) and the cathode electrode is the common electrode, the contraction rate of the potential difference set in the capacitor C10 by the shift from the write period to the light-emitting period can be almost the same in the peripheral region and the central region of the display region R10. With this, an impact on the display evenness can be reduced. In other words, the unevenness in the voltage distribution of the cathode electrode 152 as the common electrode can be reduced, and degradation in display quality can be reduced.

Moreover, a distance from the center of the display region R10 (position CP in FIG. 2) to the end of the cathode electrode 152 is shorter than a distance from the center of the display region R10 to the end of the charge functional layer 151.

A detailed description will be made later. Here, a straight line going through the position CP in FIG. 2 on the plane of the display region R10 is referred to as a straight line A. A distance from the position CP on the straight line A to the end of the cathode electrode 152 is shorter than a distance from the position CP on the straight line A to the end of the charge functional layer 151 located adjacent to the end of the cathode electrode 152. In other words, a distance from the center on the straight line A going through the center of the display region R10 (position CP) to the end of the cathode electrode 152 is shorter than a distance from the center on the straight line A to the end of the charge functional layer 151 located adjacent to the end of the cathode electrode 152. In other words, the end portion of the cathode electrode 152 on the straight line A is arranged in a position adjacent to the center (position CP) of the display region R10 from the end portion of the charge functional layer 151 on the straight line A located adjacent to the end portion of the cathode electrode 152.

Moreover, as described above, at least the parasitic capacitance C0 exists between the gate electrode of the n-type driving transistor T1 and the drain electrode of the n-type driving transistor T1. In other words, the parasitic capacitance C0 exists between the gate electrode of the n-type TFT (driving transistor T1) and the drain electrode of the n-type TFT.

In the case of a shift from the write period to the light-emitting period, a potential of the other electrode of the capacitor C10 is further increased in the peripheral region than in the central region of the display region R10 by an increase in the potential of the cathode voltage (VEE). Due to the parasitic capacitance C0 between the gate electrode of the n-type TFT (driving transistor T1) and the drain electrode of the n-type TFT, an increase in the potential of one of the electrodes of the capacitor C10 is reduced.

Accordingly, a phenomenon occurs that the potential difference set in the capacitor C10 is contracted by the shift from the write period to the light-emitting period.

Even in this case, since the potential distribution of the cathode voltage (VEE) is determined and equalized by the auxiliary wiring, the contraction rate of the potential difference set in the capacitor C10 can be equalized in the display region and degradation in display quality can be reduced.

Moreover, as described above, the auxiliary wiring 121 arranged in the peripheral region of the display region R10 is not directly connected to the cathode electrode 152 in the peripheral region of the display region R10.

Therefore, the voltage of the cathode electrode 152 in the peripheral region of the display region R10 and the voltage of the cathode electrode 152 in the display region R10 are each a voltage via the high-resistance charge functional layer 151, corresponding to the voltage set in the auxiliary wiring 121.

Accordingly, the unevenness in the voltage distribution of the cathode electrode 152 as the common electrode can be reduced, and degradation in display quality can be prevented.

Here, Expression 3 is satisfied where $R_{cont(pix)}$ represents the contact resistance between the cathode electrode 152 and the auxiliary wiring 121 per unit area in the central region of the display region R10, $R_{cont(EDGE)}$ represents the contact resistance between the cathode electrode 152 and the auxiliary wiring 121 per unit area in the peripheral region of the display region R10, $R_{CAT}$ represents the resistance of the cathode electrode 152, and $R_{BUS}$ represents the resistance of the auxiliary wiring 121.

With this, the current flowing through a pixel in the display region R10 flows through the auxiliary wiring 121 that is low resistance more preferentially than the cathode electrode 152 that is high resistance. Therefore, a rapid change in the amount of voltage drop especially by resistance of the cathode voltage electrode 152 is reduced in the peripheral region of the display region R10, and the voltage distribution of the cathode electrode 152 is equalized. Accordingly, the display variations in the display region R10 can be reduced.

It should be noted that when the organic light-emitting layer 140 is formed according to an application method, the bank 130 does not perform the function of partitioning the pixels unless the surface of the bank 130 partitioning the pixels has liquid repellency. Therefore, as described above, the bank 130 comprises an organic material. A liquid repellent process is performed on the surface of the bank 130. In other words, the surface of the bank 130 has liquid repellency.

Accordingly, the minimum amount of ink overflowing from the bank can be large when ink types different according to colors are applied, and it is possible to prevent ink of adjacent colors from mixing together. Moreover, when the organic light-emitting layer 140 is formed according to an application method, it is possible to form the applied organic light-emitting layer 140 in an equal film thickness.

Moreover, as described above, the organic material comprising the bank 130 may have liquid repellency. In this case, the liquid repellent process is not performed on the surface of the bank 130, and the bank 130 comprises an organic material having liquid repellency.

As described above, the minimum amount of ink overflowing from the bank 130 can be large even when ink types different according to colors are applied even in the case where the bank 130 comprises an organic material having liquid repellency, and it is possible to prevent ink of adjacent colors from mixing together. Moreover, when the organic light-emitting layer 140 is formed according to an application method, it is possible to form the applied organic light-emitting layer 140 in an equal film thickness.

Figure 8:
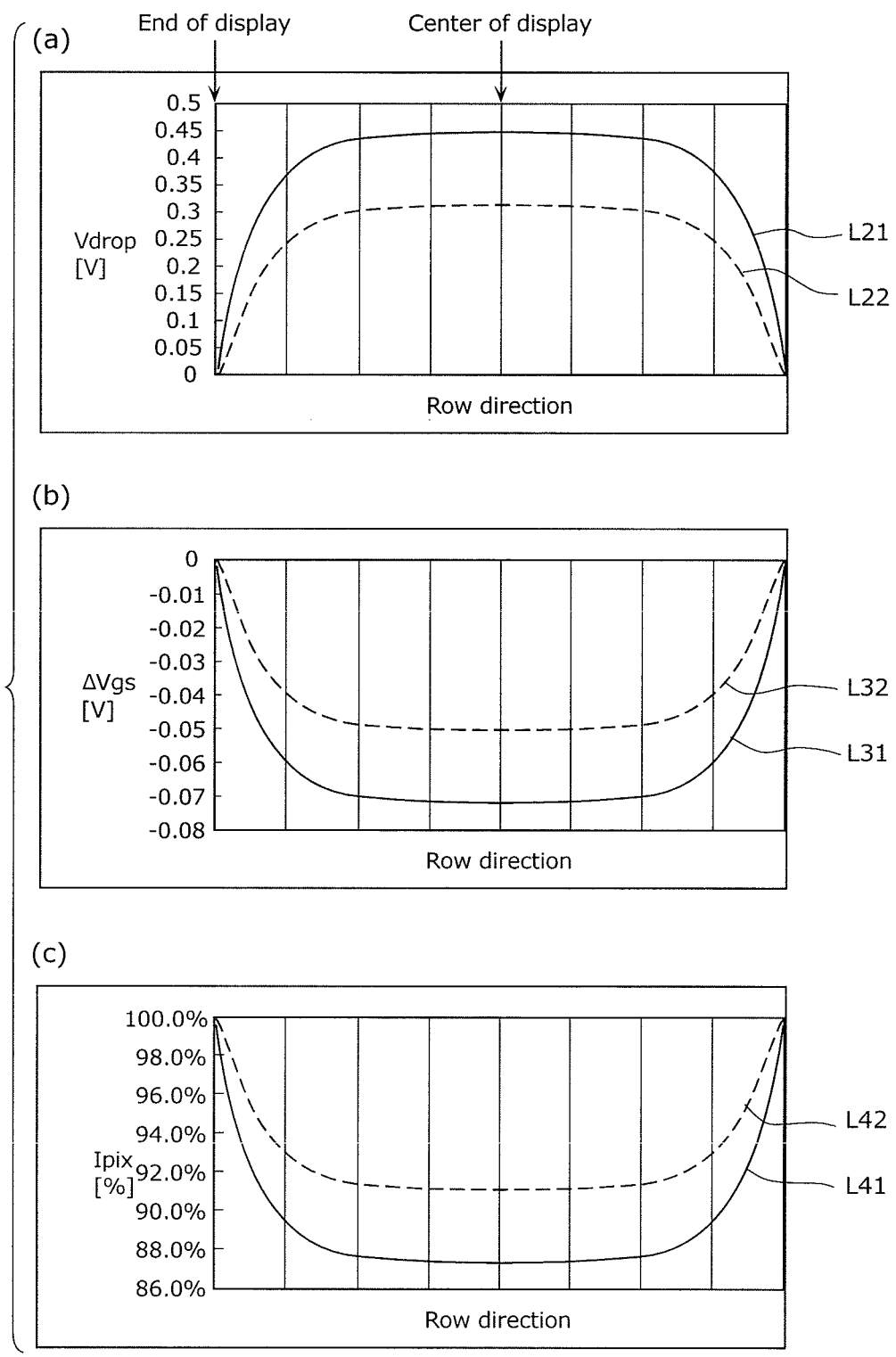
FIG. 8 (a)-(c) is a diagram illustrating an example of characteristics of a display region.

FIG. 8 is a diagram illustrating an example of characteristics of the display region.

Vdrop in (a) in FIG. 8 is an amount of voltage fluctuation, in the display region, of the cathode voltage VEE of the light-emitting element EL1 against an end of display voltage VEE0. In other words, the cathode voltage in the display region is represented by VEE0+Vdrop. A horizontal axis in (a) in FIG. 8 corresponds to one line (hereinafter also referred to as measurement line) in a horizontal direction (row direction) in the display region R10.

In other words, (a) in FIG. 8 is a diagram illustrating a change in a voltage drop of each light-emitting element EL1 corresponding to a measurement line. The end of display is an end in the horizontal direction (row direction) of the display region R10. The center of display corresponds to the position CP in FIG. 2. It should be noted that the horizontal axes of (b) and (c) in FIG. 8 are the same as the horizontal axis in (a) in FIG. 8. Moreover, the voltage and current distributions in a vertical direction (longitudinal direction) of the display region R10 are also the same as those in FIG. 8.

The characteristic line L21 indicates characteristics of the comparative technique having a configuration described in FIG. 15 (hereinafter, also referred to as the comparative technique A). The characteristic line L22 indicates characteristics of the configuration in the present embodiment.

As illustrated in (a) in FIG. 8, it turns out that the amount of change in voltage drop in the end of display and the center of display is smaller in the present embodiment than in the comparative technique A.

(b) in FIG. 8 is a diagram illustrating characteristics of the amount of change in the voltage between the gate and the source of each driving transistor T1 corresponding to a measurement line. The characteristic line L31 indicates characteristics of the comparative technique A. The characteristic line L32 indicates characteristics of the configuration in the present embodiment. As illustrated in (b) in FIG. 8, it turns out that a difference in the amount of change in the voltage between the gate and the source in the end of display and the center of display is smaller in the present embodiment than in the comparative technique A.

(c) in FIG. 8 is a diagram illustrating characteristics of a current flowing through each sub-pixel unit PX corresponding to a measurement line. The characteristic line L41 indicates characteristics of the comparative technique A. The characteristic line L42 indicates characteristics of the configuration in the present embodiment. As illustrated in (c) in FIG. 8, it turns out that the amount of change in current flowing in the sub-pixel unit in the end of display and the center of display is smaller in the present embodiment than in the comparative technique A.

In other words, FIG. 8 illustrates that the display variations are further reduced in the present embodiment than in the comparative technique A.

It should be noted that the circuit configuration of the sub-pixel unit PX is not limited to that illustrated in FIG. 4. For example, the circuit configuration of the sub-pixel unit PX may be a circuit configuration illustrated in FIG. 9.

Figure 9:
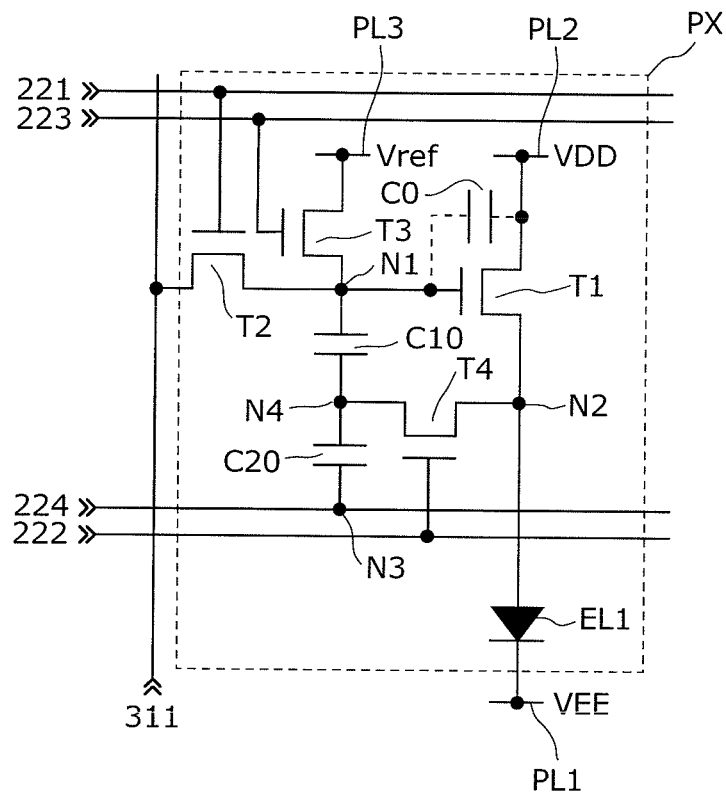
FIG. 9 is a diagram illustrating another example of a circuit configuration of a sub-pixel unit.

The difference of the circuit configuration in FIG. 9 from the circuit configuration in FIG. 4 is that control lines 223 and 224 are provided in association with the sub-pixel unit PX and that a capacitor C20 is further provided. It should be noted that the circuit in FIG. 9 is a circuit to compensate a threshold voltage $V_T$ of the driving transistor T1.

Figure 10:
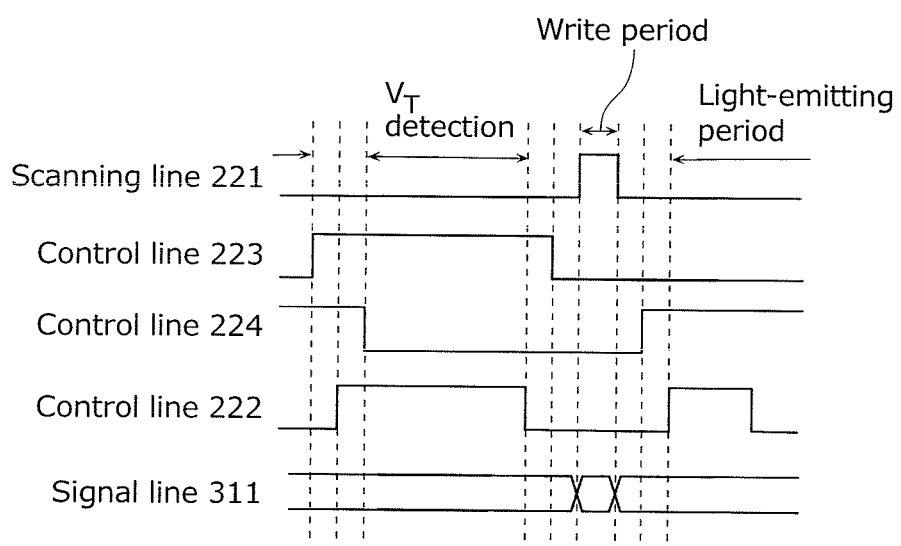
FIG. 10 is a timing chart for explaining an operation of a sub-pixel unit.

The circuit illustrated in FIG. 9 operates according to a timing chart illustrated in FIG. 10.

Even when the circuit configuration of the sub-pixel unit PX is the circuit configuration in FIG. 9 but when the configuration adjacent to the end portion of the display region R10 is the configuration of the comparative technique A, the same problem as described before is generated.

In the present embodiment, however, even when the circuit configuration of the sub-pixel unit PX is the circuit configuration in FIG. 9, the advantageous effects can be obtained by making the configuration adjacent to the end portion of the display region R10 the configuration in FIG. 6B.

It should be noted that the configurations of the power line 110 and the auxiliary wiring 121 are not limited to the configuration in (a) in FIG. 7. For example, as illustrated in (b) in FIG. 7, the auxiliary wirings 121 included in the display panel 100 may be arranged only along a vertical direction. The above described Expression 3 is also satisfied in this configuration. In this case, when the pixel A exists in the region R32 in (b) in FIG. 7, m≠n.

Moreover, for example, as illustrated in (c) in FIG. 7, the configuration is acceptable where two power lines 110 are arranged between two long sides of the display region R10. It should be noted that the two power lines 110 are electrically connected to the auxiliary wirings 121 along a vertical direction. The above described Expression 3 is satisfied in this configuration. In this case, when the pixel A exists in the region R33 in (c) in FIG. 7, m=n.

Moreover, for example, as illustrated in (d) in FIG. 7, the configuration is acceptable where one power line 110 is arranged adjacent to one of the two long sides of the display region R10. The auxiliary wirings 121 along a vertical direction are electrically connected to the power line 110. The above described Expression 3 is satisfied in this configuration. In this case, when the pixel A exists in the region R34 in (d) in FIG. 7, m=n.

<Modification 1 of Embodiment 1>

Next, a configuration according to Modification 1 of Embodiment 1 will be described.

Figure 11:
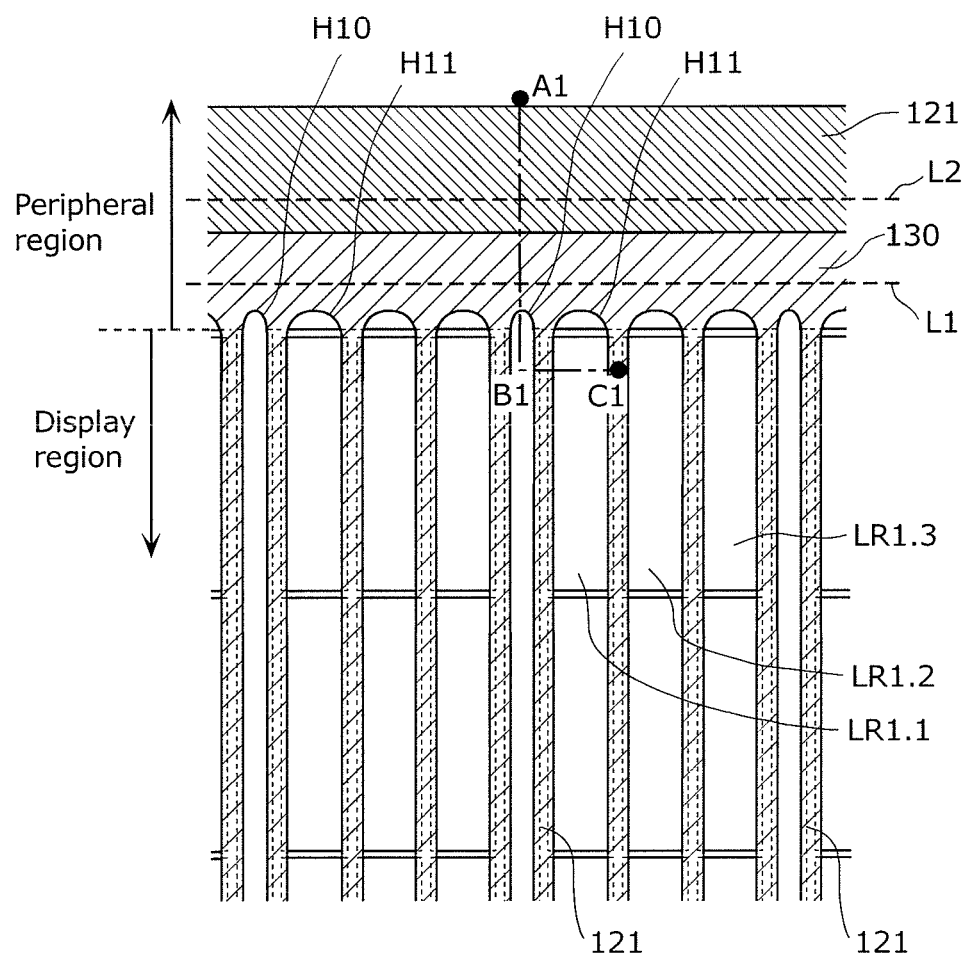
FIG. 11 is a diagram illustrating an enlarged configuration of a region adjacent to an end portion of a display region.

FIG. 11 is a diagram illustrating the enlarged display region R20 located adjacent to the end portion of the display region R10.

Figure 12:
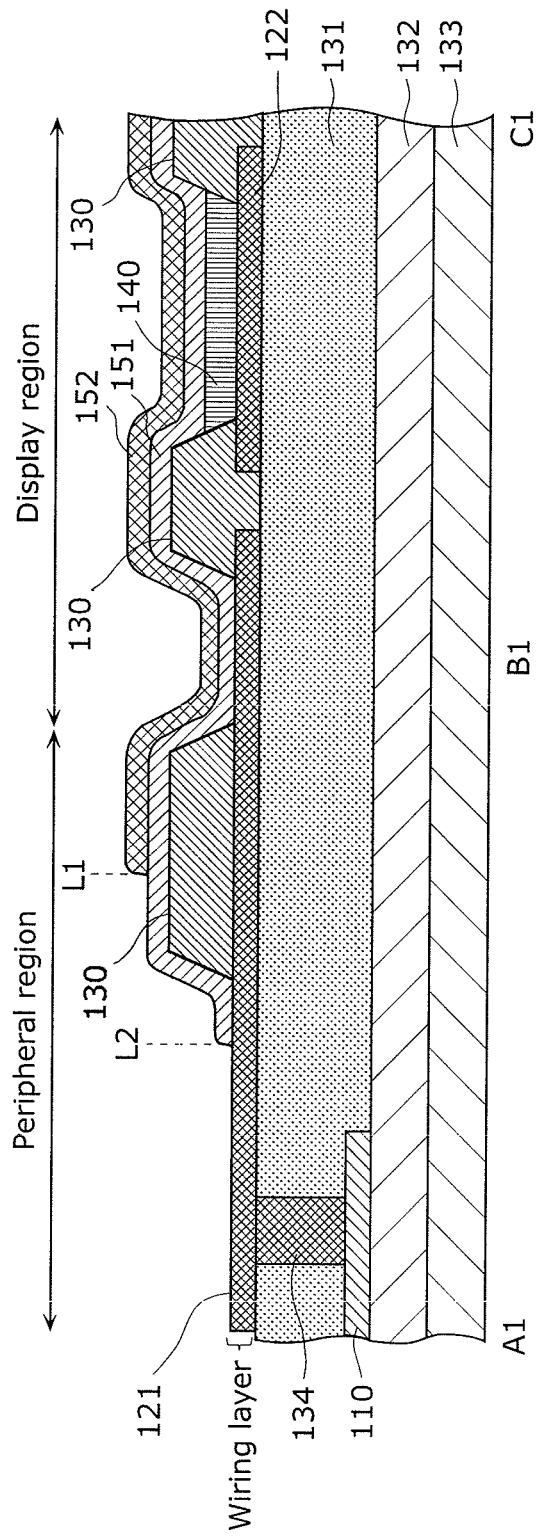
FIG. 12 is a cross-sectional view of part of a display panel according to Modification 1 of Embodiment 1 of the present invention.

FIG. 12 is a cross-sectional view of part of the display panel 100 according to Modification 1 of Embodiment 1 of the present invention. Specifically, FIG. 12 is a cross-sectional view of a region adjacent to the end portion of the display region R10, along the line A1-C1 illustrated in FIG. 11. The line L1 in FIGS. 11 and 12 indicates the position of the end of the cathode electrode 152 in the peripheral region A. The line L2 in FIGS. 11 and 12 indicates the position of the end of the charge functional layer 151 in the peripheral region A.

As illustrated in FIG. 12, in Modification 1 of Embodiment 1, the configurations of the cathode electrode 152 and the charge functional layer 151 are the same as those in FIG. 6B in Embodiment 1. In other words, a distance from the center of the display region R10 (position CP in FIG. 2) to the end of the cathode electrode 152 is shorter than a distance from the center of the display region R10 to the end of the charge functional layer 151. Specifically, as described above, a distance from the center on the straight line A going through the center of the display region R10 (position CP) to the end of the cathode electrode 152 is shorter than a distance from the center on the straight line A to the end of the charge functional layer 151 located adjacent to the end of the cathode electrode 152.

Moreover, the end portion of the cathode electrode 152 is provided above the bank 130 located adjacent to a boundary between the display region R10 and the peripheral region of the display region R10.

Specifically, the end portion of the charge functional layer 151 is extended to cover the whole of the bank 130 located adjacent to a boundary between the display region R10 and the peripheral region of the display region R10. In other words, the end portion of the charge functional layer 151 is connected to the auxiliary wiring 121 in the peripheral region of the display region R10. It should be noted that in the peripheral region of the display region R10, the end portion of the cathode electrode 152 is not connected to the auxiliary wiring 121.

It should be noted that the configurations other than the above described configurations in FIG. 12 will not be described in detail because the configurations are the same as those in FIG. 6B.

The advantageous effects can be obtained from the configuration according to Modification 1 of Embodiment 1 as similarly to the configuration according to Embodiment 1. In other words, the unevenness in the voltage distribution of the cathode electrode 152 as the common electrode can be reduced, and degradation in display quality can be reduced. Moreover, the same advantageous effects can be obtained even when in the vicinity of the end portion of the charge functional layer 151, the charge functional layer 151 is a mixture of a portion covered by the cathode electrode 152 and a portion not covered by the cathode electrode 152.

<Modification 2 of Embodiment 1>

Next, a configuration according to Modification 2 of Embodiment 1 will be described.

Figure 13:
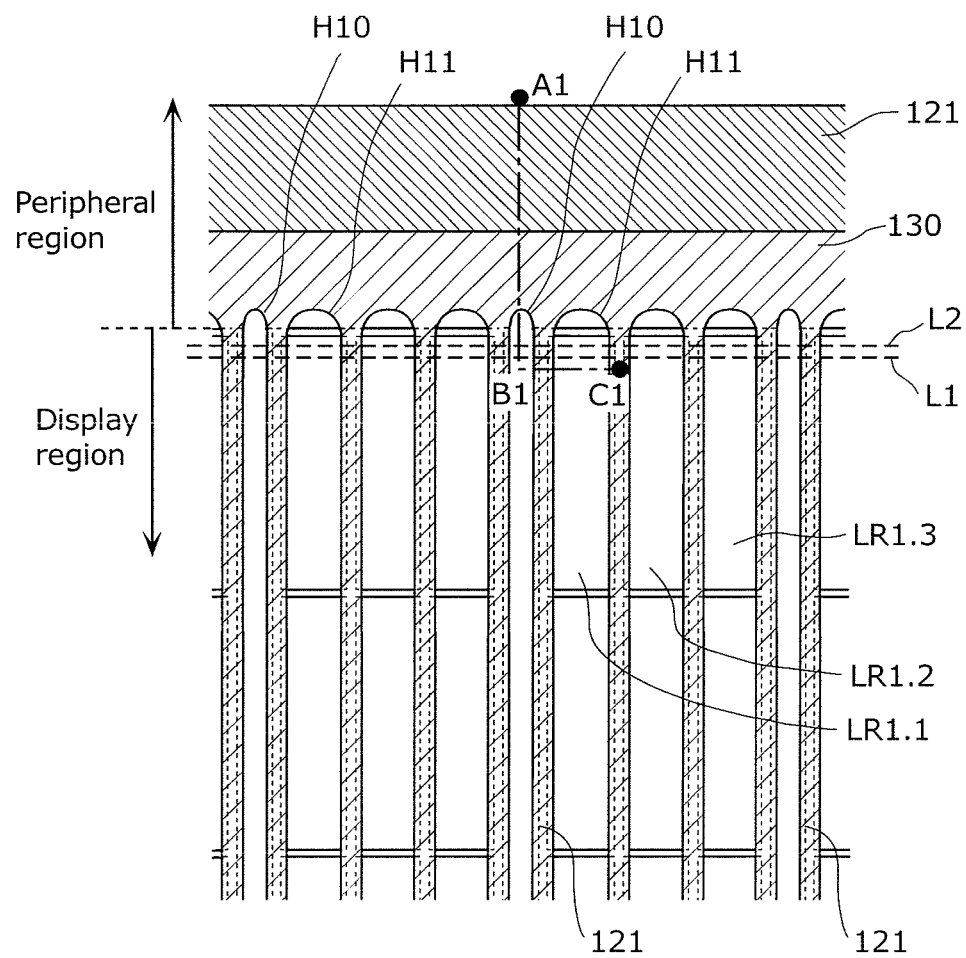
FIG. 13 is a diagram illustrating an enlarged configuration of a region adjacent to an end portion of a display region.

FIG. 13 is a diagram illustrating the enlarged display region R20 located adjacent to the end portion of the display region R10.

Figure 14:
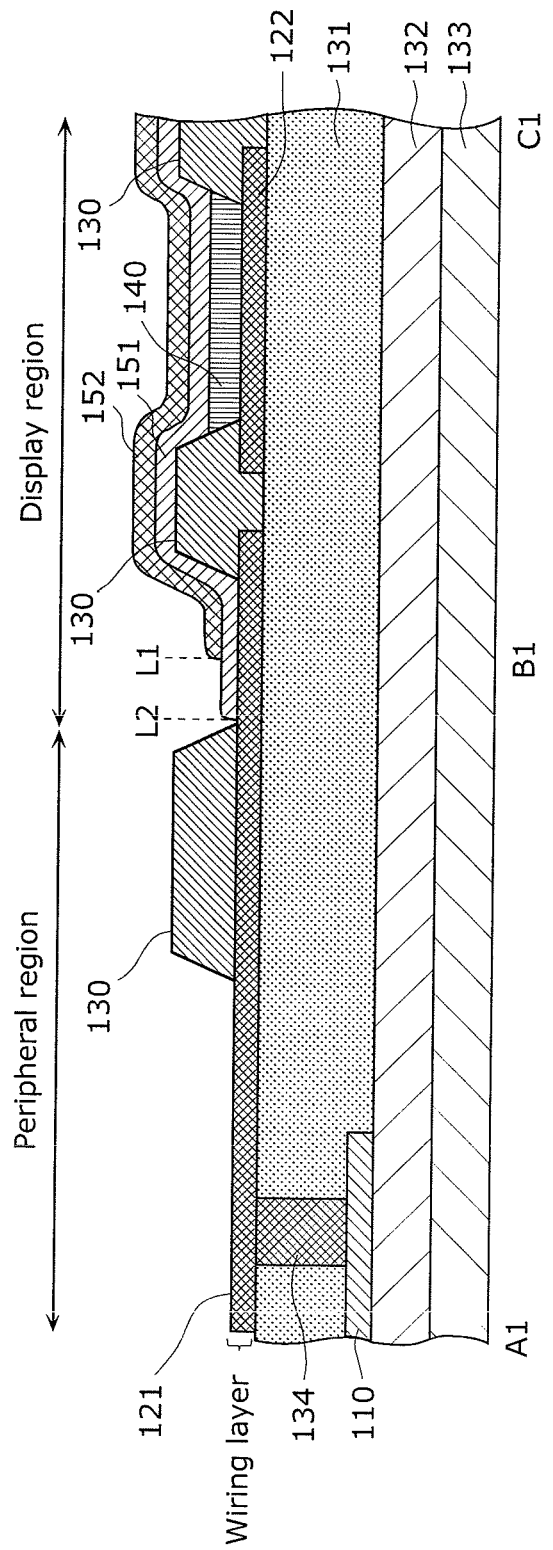
FIG. 14 is a cross-sectional view of part of a display panel according to Modification 2 of Embodiment 1 of the present invention.

FIG. 14 is a cross-sectional view of part of the display panel 100 according to Modification 2 of Embodiment 1 of the present invention. Specifically, FIG. 14 is a cross-sectional view of a region adjacent to the end portion of the display region R10, along the line A3-C1 illustrated in FIG. 13. The line L1 in FIGS. 13 and 14 indicates the position of the end of the cathode electrode 152 in the peripheral region of the display region R10. The line L2 in FIGS. 13 and 14 indicates the position of the end of the charge functional layer 151 in the peripheral region of the display region R10.

As illustrated in FIG. 12, in Modification 2 of Embodiment 1, the configurations of the cathode electrode 152 and the charge functional layer 151 are the same as those in Embodiment 1. In other words, a distance from the center of the display region R10 (position CP in FIG. 2) to the end of the cathode electrode 152 is shorter than a distance from the center of the display region R10 to the end of the charge functional layer 151. Specifically, as described above, a distance from the center on the straight line A going through the center of the display region R10 (position CP) to the end of the cathode electrode 152 is shorter than a distance from the center on the straight line A to the end of the charge functional layer 151 located adjacent to the end of the cathode electrode 152.

Moreover, the end portion of the cathode electrode 152 and the end portion of the charge functional layer 151 are provided in the end portion (peripheral region) of the display region R10.

It should be noted that in the end portion (peripheral region) of the display region R10, the end portion of the cathode electrode 152 is not connected to the auxiliary wiring 121.

It should be noted that the configurations other than the above described configurations in FIG. 14 will not be described in detail because the configurations are the same as those in FIG. 6B.

The advantageous effects can be obtained from the configuration according to Modification 2 of Embodiment 1 as similarly to the configuration according to Embodiment 1. In other words, the unevenness in the voltage distribution of the cathode electrode 152 as the common electrode can be reduced, and degradation in display quality can be reduced. Moreover, the same advantageous effects can be obtained even when in the vicinity of the end portion of the charge functional layer 151, the charge functional layer 151 is a mixture of a portion covered by the cathode electrode 152 and a portion not covered by the cathode electrode 152.

<Modification 3 of Embodiment 1>

Next, a configuration according to Modification 3 of Embodiment 1 will be described.

Figure 15:
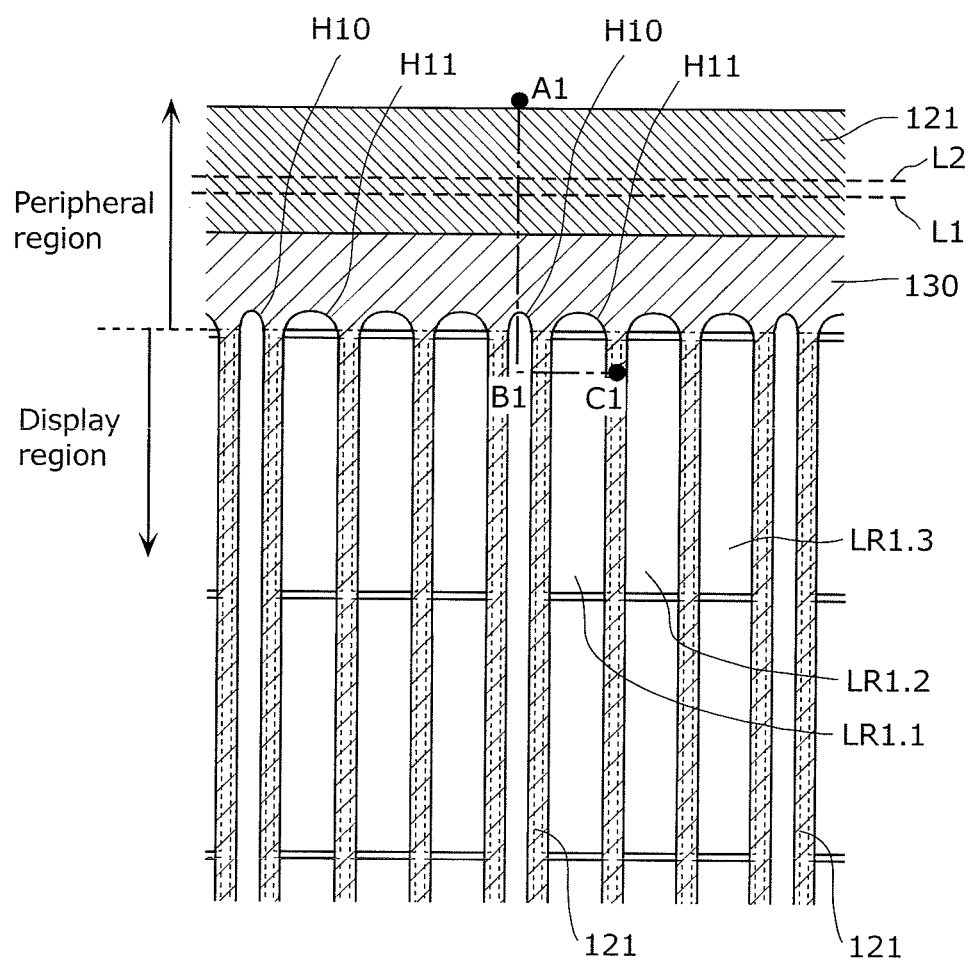
FIG. 15 is a diagram illustrating an enlarged configuration of a region adjacent to an end portion of a display region.

FIG. 15 is a diagram of an enlarged region R20 adjacent to the end portion of the display region R10.

Figure 16:
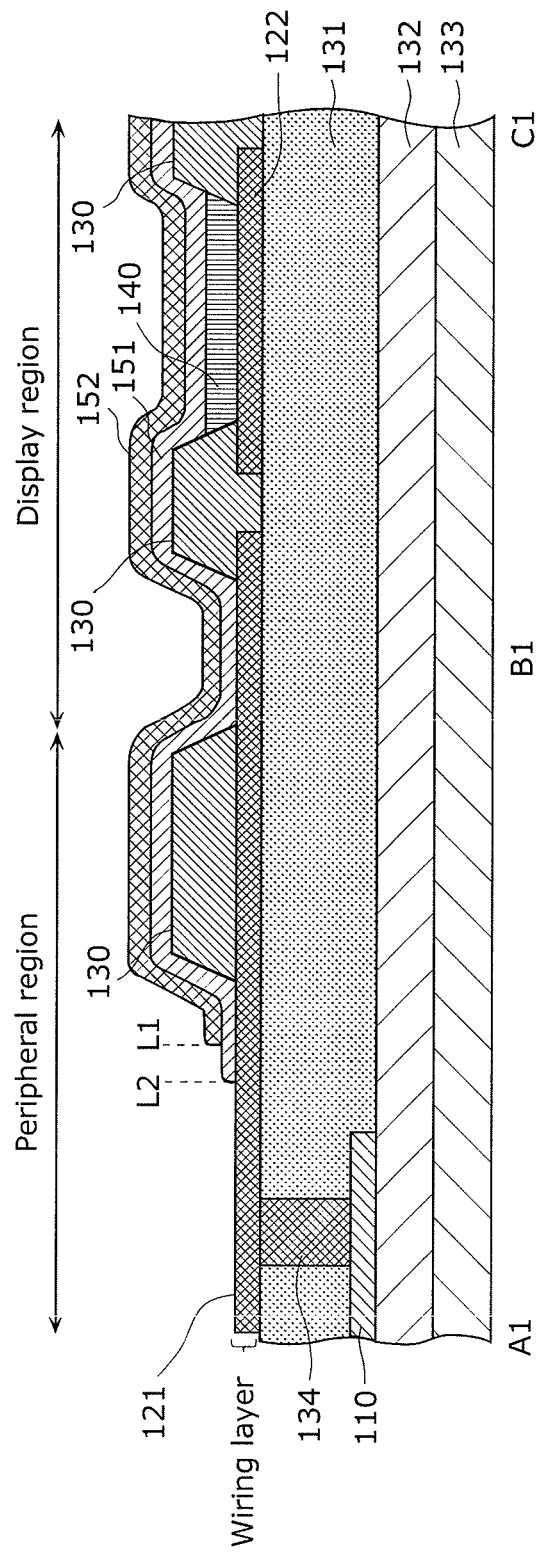
FIG. 16 is a cross-sectional view of part of a display panel according to Modification 3 of Embodiment 1 of the present invention.

FIG. 16 is a cross-sectional view of part of the display panel 100 according to Modification 3 of Embodiment 1 of the present invention. Specifically, FIG. 16 is a cross-sectional view of a region adjacent to the end portion of the display region R10, along the line A1-C1 in FIG. 15. The line L1 in FIGS. 15 and 16 indicates the position of the end of the cathode electrode 152 in the peripheral region A. The line L2 in FIGS. 15 and 16 indicates the position of the end of the charge functional layer 151 in the peripheral region A.

As illustrated in FIG. 16, in Modification 3 of Embodiment 1, the configurations of the cathode electrode 152 and the charge functional layer 151 are the same as those in Embodiment 1. In other words, a distance from the center of the display region R10 (position CP in FIG. 2) to the end of the cathode electrode 152 is shorter than a distance from the center of the display region R10 to the end of the charge functional layer 151. Specifically, as described above, a distance from the center on the straight line A going through the center of the display region R10 (position CP) to the end of the cathode electrode 152 is shorter than a distance from the center on the straight line A to the end of the charge functional layer 151 located adjacent to the end of the cathode electrode 152.

Moreover, the end portion of the cathode electrode 152 and the end portion of the charge functional layer 151 are extended to cover the whole of the bank 130 located adjacent to a boundary between the display region R10 and the peripheral region of the display region R10.

It should be noted that in the peripheral region of the display region R10, the end portion of the cathode electrode 152 is not connected to the auxiliary wiring 121.

It should be noted that the configurations other than the above described configurations in FIG. 16 will not be described in detail because the configurations are the same as those in FIG. 6B The advantageous effects can be obtained from the configuration according to Modification 3 of Embodiment 1 as similarly to the configuration according to Embodiment 1. In other words, the unevenness in the voltage distribution of the cathode electrode 152 as the common electrode can be reduced, and degradation in display quality can be reduced.

Moreover, the auxiliary wiring 121 arranged in the peripheral region of the display region R10 is not directly connected to the cathode electrode 152 in the peripheral region of the display region R10.

Therefore, the voltage set between the auxiliary wiring 121 and the cathode electrode 152 in the peripheral region of the display region R10 and the voltage set between the auxiliary wiring 121 and the cathode electrode 152 in the display region R10 are a voltage via the charge functional layer 151. Accordingly, the unevenness in the voltage distribution of the cathode electrode 152 as the common electrode can be reduced, and degradation in display quality can be prevented. Moreover, the same advantageous effects can be obtained even when in the vicinity of the end portion of the charge functional layer 151, the charge functional layer 151 is a mixture of a portion covered by the cathode electrode 152 and a portion not covered by the cathode electrode 152.

(External View of Display Apparatus)

FIG. 17 is an external view of the display apparatus 1000 including the display panel 100.

Although the display apparatus according to the present invention has been described based on the embodiment, the present invention is not limited only to the embodiment. For example, it is possible that the position of the end portion of the charge functional layer 151 and the position of the end portion of the cathode electrode 152 are a combination of the embodiment and each of the modifications. Those skilled in the art will readily appreciate that various modifications or configurations through combining structural elements in different embodiments may be made in these exemplary embodiments without materially departing from the principles and spirit of the inventive concept, the scope of which is defined in the appended Claims and their equivalents.

Moreover, the present invention is applicable to a pixel configuration where a pixel current fluctuates due to unevenness of voltage distribution of the common electrode. For example, it is acceptable that the driving TFT is a p-type TFT. When the p-type TFT is operating in a saturation region, the pixel current depends on the voltage between the source and the drain of the driving TFT, the unevenness in voltage distributions of the common electrode changes the voltage between the source and the drain of the driving TFT. Accordingly, the pixel current is uneven. Therefore, when the evenness in voltage distributions of the common electrode is increased, the pixel current can be even and display quality can be increased.

It should be considered that the disclosed embodiment is exemplary and not limited. The scope of the present invention is indicated by not the above description but by Claims, and is intended to change within the appended Claims and their equivalents.

INDUSTRIAL APPLICABILITY

The present invention is applicable to an organic EL display panel and an organic EL display apparatus which can improve the unevenness in voltage distributions of the common voltage and can reduce degradation in display quality.

REFERENCE SIGNS LIST

100 Display panel
110, 110J Power line
121, 121J Auxiliary wiring
122, 122J Anode electrode
130, 130J Bank
131, 131J Insulating layer
132, 132J TFT layer
133, 133J Substrate
134, 134J Contact plug
140, 140J Organic light-emitting layer
151, 151J Charge functional layer
152, 152J Cathode electrode
200 Scanning line driving circuit
300 Data line driving circuit
1000 Display apparatus
C0 Parasitic capacitance
C10 Capacitor
EL1, EL9 Light-emitting element
H10, H11 Aperture area
PX. PX.R, PX.G, PX.B, PX9 Sub-pixel unit
PX10 Pixel unit
T1 Driving transistor
T2, T3, T4 Switching transistor

The invention claimed is:

1. An organic electroluminescence (EL) display panel comprising:
   a thin-film transistor (TFT) layer including an n-type TFT as a driving TFT;
   an insulating layer provided above the TFT layer;
   a plurality of anode electrodes arranged in a display region located above the insulating layer;
   an auxiliary wiring which is arranged in a peripheral region of the display region and in the display region and is arranged separately from the anode electrodes in the display region;
   a bank in which a plurality of aperture areas are provided above the anode electrodes or the auxiliary wiring in the display region;
   a cathode electrode provided above the bank and provided above the anode electrodes;
   an organic light-emitting layer provided between the anode electrodes and the cathode electrode, and provided in each of the plurality of aperture areas above the anode electrodes in the bank;
   a charge functional layer commonly provided for each of a plurality of the organic light-emitting layers across the plurality of aperture areas, the charge functional layer being provided between the cathode electrode and the bank; and
   a power line which is provided in the peripheral region and provides power to the cathode electrode,
   wherein the n-type TFT includes a source electrode electrically connected to the anode electrode,
   the organic light-emitting layer emits light when current corresponding to a voltage between a gate electrode and the source electrode of the n-type TFT flow in a light-emitting period via the anode electrodes to the cathode electrode,
   a distance from a center of the display region to an end of the cathode electrode is shorter than a distance from the center of the display region to an end of the charge functional layer, and
   the cathode electrode receives power from the power line at least via the charge functional layer.

2. The organic EL display panel according to claim 1,
   wherein the cathode electrode receives power from the power line in a whole region of the cathode electrode at least via the charge functional layer.

3. The organic EL display panel according to claim 1,
   wherein a parasitic capacitance exists between the gate electrode of the n-type TFT and a drain electrode of the n-type TFT.

4. The organic EL display panel according to claim 1,
   wherein the power line is electrically connected to the auxiliary wiring arranged in the peripheral region of the display region,
   the auxiliary wiring arranged in the peripheral region of the display region is connected to the auxiliary wiring arranged in the display region via below the bank located adjacent to a boundary between the display region and the peripheral region of the display region, and
   the cathode electrode is connected to the auxiliary wiring arranged in the display region via the charge functional layer.

5. The organic EL display panel according to claim 4,
   wherein the auxiliary wiring arranged in the peripheral region of the display region is not directly connected to the cathode electrode in the peripheral region of the display region.

6. The organic EL display panel according to claim 1, wherein a value of sheet resistance of the cathode electrode is greater than a value of sheet resistance of the auxiliary wiring.

7. The organic EL display panel according to claim 1, wherein an expression of $R_{cont(EDGE)}+R_{CAT} \geq R_{cont(pix)}+R_{BUS}$ is satisfied where $R_{cont(pix)}$ represents contact resistance between the cathode electrode and the auxiliary wiring per unit area in a central region of the display region, $R_{cont(EDGE)}$ represents contact resistance between the cathode electrode and the auxiliary wiring per unit area in a peripheral region of the display region, $R_{CAT}$ represents resistance of the cathode electrode, and $R_{BUS}$ represents resistance of the auxiliary wiring.

8. The organic EL display panel according to claim 1, wherein the anode electrodes and the auxiliary wiring are provided in a same layer above the insulating layer.

9. The organic EL display panel according to claim 1, wherein an end portion of the cathode electrode and an end portion of the charge functional layer extend to above the bank located adjacent to a boundary between the display region and the peripheral region of the display region.

10. The organic EL display panel according to claim 1, wherein the bank comprises an organic material, and has a surface on which a liquid repellent process is performed.

11. The organic EL display panel according to claim 1, wherein the bank comprises an organic material having liquid repellency.

12. The organic EL display panel according to claim 1, wherein the charge functional layer includes at least an electron transport layer or an electron injection layer.

13. An organic electroluminescence (EL) display apparatus comprising
the organic EL display panel according to claim 1.

14. An organic electroluminescence (EL) display panel comprising:
a plurality of anode electrodes arranged in a display region located above a substrate;
an auxiliary wiring which is arranged in a peripheral region of the display region and in the display region and is arranged separately from the anode electrodes in the display region;
a bank in which a plurality of aperture areas are provided above the anode electrodes or the auxiliary wiring in the display region;
a cathode electrode provided above the bank and provided above the anode electrodes;
an organic light-emitting layer provided between the anode electrodes and the cathode electrode, and provided in each of the plurality of aperture areas above the anode electrodes in the bank;
a charge functional layer commonly provided for each of a plurality of the organic light-emitting layers across the plurality of aperture areas, the charge functional layer being provided between the cathode electrode and the bank; and
a power line which is provided in the peripheral region and provides power to the cathode electrode,
wherein a distance from a center of the display region to an end of the cathode electrode is shorter than a distance from the center of the display region to an end of the charge functional layer, and
the cathode electrode receives power from the power line at least via the charge functional layer.

* * * * *